(12) United States Patent
Rhee et al.

(10) Patent No.: US 6,269,129 B1
(45) Date of Patent: Jul. 31, 2001

(54) 64/256 QUADRATURE AMPLITUDE MODULATION TRELLIS CODED MODULATION DECODER

(75) Inventors: Dojun Rhee, San Jose, CA (US); Chanthachith Souvanthong, Tourcoing (FR)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/066,048

(22) Filed: Apr. 24, 1998

(51) Int. Cl.$^7$ .................................................. H03D 1/00
(52) U.S. Cl. ............................................................. 375/341
(58) Field of Search ................................... 375/341, 224, 375/246

(56) References Cited

U.S. PATENT DOCUMENTS

| | | | |
|---|---|---|---|
| 5,396,518 | * 3/1995 | How | 375/365 |
| 5,469,452 | * 11/1995 | Zehavi | 714/792 |
| 5,737,365 | * 4/1998 | Gilbert et al. | 375/224 |
| 6,005,897 | * 12/1999 | McCallister et al. | 375/340 |

OTHER PUBLICATIONS

Unknown, "Digital Multi–Programme Systems for Television Sound and Data Services for Cable Distribution", 10/95, International Telecommunication Union (ITU), Recommendation J.83.

Stephen B. Wicker, "The Viterbi Decoding Algorithm", pp. 290–331, 1995, Error Control Systems for Digital Communication and Storage, Prentice Hall, New Jersey.

* cited by examiner

Primary Examiner—Chi Pham
Assistant Examiner—Kevin Burd

(57) ABSTRACT

A quadrature amplitude modulation (QAM) trellis coded modulation (TCM) decoder for decoding a stream of QAM TCM signals is disclosed. Each of the signals has a plurality of associated branch metrics and has an in-phase component and a quadrature component. The in-phase component is defined by a plurality of in-phase symbols and the quadrature component is defined by a plurality of quadrature symbols. The QAM TCM decoder includes a first Viterbi decoder and a second Viterbi decoder. The first Viterbi decoder is configured to receive an in-phase component of a QAM TCM signal for decoding the associated in-phase symbols into an in-phase decoded bit and a plurality of uncoded in-phase bits. The second Viterbi decoder configured to receive a quadrature component of the QAM TCM signal for decoding the associated quadrature symbols into a quadrature decoded bit and a plurality of uncoded quadrature bits. The first and second Viterbi decoders are adapted to decode 64- or 256-QAM TCM signals.

41 Claims, 12 Drawing Sheets

| (I,Q) | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | (0,0) | (0,15) | (14,0) | (0,1) | (0,2) | (2,15) | (12,0) | (0,3) | (0,4) | (4,15) | (10,0) | (0,5) | (0,6) | (6,15) | (8,0) | (0,7) |
| 1 | (15,0) | (15,8) | (15,9) | (1,15) | (13,0) | (15,13) | (15,11) | (3,15) | (11,0) | (15,12) | (15,10) | (5,15) | (9,0) | (15,14) | (15,15) | (7,15) |
| 2 | (0,14) | (14,8) | (14,9) | (14,1) | (2,14) | (14,10) | (14,11) | (12,1) | (4,14) | (14,12) | (14,13) | (10,1) | (6,14) | (14,14) | (14,15) | (8,1) |
| 3 | (1,0) | (15,1) | (1,14) | (1,1) | (1,2) | (13,1) | (3,14) | (1,3) | (1,4) | (11,1) | (5,14) | (1,5) | (1,6) | (9,1) | (7,9) | (1,7) |
| 4 | (2,0) | (0,13) | (14,2) | (2,1) | (2,2) | (2,13) | (12,2) | (2,3) | (2,4) | (4,13) | (10,2) | (2,5) | (2,6) | (6,12) | (8,2) | (2,7) |
| 5 | (15,2) | (13,8) | (13,9) | (1,13) | (13,2) | (13,10) | (13,11) | (3,13) | (11,2) | (13,12) | (13,13) | (5,13) | (9,2) | (13,14) | (13,15) | (7,13) |
| 6 | (0,12) | (12,8) | (12,9) | (1,13) | (2,12) | (12,10) | (12,11) | (12,3) | (4,12) | (12,12) | (12,13) | (10,3) | (6,12) | (12,14) | (12,15) | (8,3) |
| 7 | (3,0) | (15,3) | (1,12) | (3,1) | (3,2) | (13,3) | (3,12) | (3,3) | (3,4) | (11,3) | (5,12) | (3,5) | (3,6) | (9,3) | (7,12) | (3,7) |
| 8 | (4,0) | (0,11) | (14,4) | (4,1) | (4,2) | (2,11) | (12,4) | (4,3) | (4,4) | (4,11) | (10,4) | (4,5) | (4,6) | (6,11) | (8,4) | (4,7) |
| 9 | (15,4) | (11,8) | (11,9) | (1,11) | (13,4) | (11,10) | (11,12) | (3,11) | (11,4) | (11,11) | (11,13) | (5,11) | (9,4) | (11,14) | (11,15) | (7,11) |
| 10 | (0,10) | (10,8) | (10,9) | (14,5) | (2,10) | (10,10) | (10,11) | (12,5) | (4,10) | (10,12) | (10,13) | (10,5) | (6,10) | (10,14) | (10,15) | (8,5) |
| 11 | (5,0) | (15,5) | (1,10) | (5,1) | (5,2) | (13,5) | (3,10) | (5,3) | (5,4) | (11,5) | (5,10) | (5,5) | (5,6) | (9,5) | (7,10) | (5,7) |
| 12 | (6,0) | (0,9) | (14,6) | (6,1) | (6,2) | (2,9) | (12,6) | (6,3) | (6,4) | (4,9) | (10,6) | (6,5) | (6,6) | (6,9) | (8,6) | (6,7) |
| 13 | (15,6) | (9,8) | (9,9) | (1,9) | (13,6) | (9,10) | (9,11) | (3,9) | (11,6) | (9,12) | (9,13) | (5,9) | (9,6) | (9,14) | (9,15) | (7,9) |
| 14 | (0,8) | (8,8) | (8,9) | (14,7) | (2,8) | (8,10) | (8,11) | (12,7) | (4,8) | (8,12) | (8,13) | (10,7) | (6,8) | (8,14) | (8,15) | (8,7) |
| 15 | (7,0) | (15,7) | (1,8) | (7,1) | (7,2) | (13,7) | (3,8) | (7,3) | (7,4) | (11,7) | (5,8) | (7,5) | (7,6) | (9,7) | (7,8) | (7,7) |

FIG. 3b
(PRIOR ART)

| (X,Y) | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 1,1 | 1,3 | 1,5 | 1,7 | 1,9 | 1,11 | 1,13 | 1,15 | 1,-15 | 1,-13 | 1,-11 | 1,-9 | 1,-7 | 1,-5 | 1,-3 | 1,-1 |
| 1 | 3,1 | 3,3 | 3,5 | 3,7 | 3,9 | 3,11 | 3,13 | 3,15 | 3,-15 | 3,-13 | 3,-11 | 3,-9 | 3,-7 | 3,-5 | 3,-3 | 3,-1 |
| 2 | 5,1 | 5,3 | 5,5 | 5,7 | 5,9 | 5,11 | 5,13 | 5,15 | 5,-15 | 5,-13 | 5,-11 | 5,-9 | 5,-7 | 5,-5 | 5,-3 | 5,-1 |
| 3 | 7,1 | 7,3 | 7,5 | 7,7 | 7,9 | 7,11 | 7,13 | 7,15 | 7,-15 | 7,-13 | 7,-11 | 7,-9 | 7,-7 | 7,-5 | 7,-3 | 7,-1 |
| 4 | 9,1 | 9,3 | 9,5 | 9,7 | 9,9 | 9,11 | 9,13 | 9,15 | 9,-15 | 9,-13 | 9,-11 | 9,-9 | 9,-7 | 9,-5 | 9,-3 | 9,-1 |
| 5 | 11,1 | 11,3 | 11,5 | 11,7 | 11,9 | 11,11 | 11,13 | 11,15 | 11,-15 | 11,-13 | 11,-11 | 11,-9 | 11,-7 | 11,-5 | 11,-3 | 11,-1 |
| 6 | 13,1 | 13,3 | 13,5 | 13,7 | 13,9 | 13,11 | 13,13 | 13,15 | 13,-15 | 13,-13 | 13,-11 | 13,-9 | 13,-7 | 13,-5 | 13,-3 | 13,-1 |
| 7 | 15,1 | 15,3 | 15,5 | 15,7 | 15,9 | 15,11 | 15,13 | 15,15 | 15,-15 | 15,-13 | 15,-11 | 15,-9 | 15,-7 | 15,-5 | 15,-3 | 15,-1 |
| 8 | -15,1 | -15,3 | -15,5 | -15,7 | -15,9 | -15,11 | -15,13 | -15,15 | -15,-15 | -15,-13 | -15,-11 | -15,-9 | -15,-7 | -15,-5 | -15,-3 | -15,-1 |
| 9 | -13,1 | -13,3 | -13,5 | -13,7 | -13,9 | -13,11 | -13,13 | -13,15 | -13,-15 | -13,-13 | -13,-11 | -13,-9 | -13,-7 | -13,-5 | -13,-3 | -13,-1 |
| 10 | -11,1 | -11,3 | -11,5 | -11,7 | -11,9 | -11,11 | -11,13 | -11,15 | -11,-15 | -11,-13 | -11,-11 | -11,-9 | -11,-7 | -11,-5 | -11,-3 | -11,-1 |
| 11 | -9,1 | -9,3 | -9,5 | -9,7 | -9,9 | -9,11 | -9,13 | -9,15 | -9,-15 | -9,-13 | -9,-11 | -9,-9 | -9,-7 | -9,-5 | -9,-3 | -9,-1 |
| 12 | -7,1 | -7,3 | -7,5 | -7,7 | -7,9 | -7,11 | -7,13 | -7,15 | -7,-15 | -7,-13 | -7,-11 | -7,-9 | -7,-7 | -7,-5 | -7,-3 | -7,-1 |
| 13 | -5,1 | -5,3 | -5,5 | -5,7 | -5,9 | -5,11 | -5,13 | -5,15 | -5,-15 | -5,-13 | -5,-11 | -5,-9 | -5,-7 | -5,-5 | -5,-3 | -5,-1 |
| 14 | -3,1 | -3,3 | -3,5 | -3,7 | -3,9 | -3,11 | -3,13 | -3,15 | -3,-15 | -3,-13 | -3,-11 | -3,-9 | -3,-7 | -3,-5 | -3,-3 | -3,-1 |
| 15 | -1,1 | -1,3 | -1,5 | -1,7 | -1,9 | -1,11 | -1,13 | -1,15 | -1,-15 | -1,-13 | -1,-11 | -1,-9 | -1,-7 | -1,-5 | -1,-3 | -1,-1 |

64/256 QUADRATURE AMPLITUDE MODULATION TRELLIS CODED MODULATION DECODER

CROSS REFERENCE TO RELATED APPLICATIONS

The present application claims is related to co-pending U.S. patent application having Ser. No. 09/065,751, filed Apr. 24, 1998, entitled "APPARATUS AND METHOD FOR RECOVERING INFORMATION BITS FROM A 64/256-QUADRATURE AMPLITUDE MODULATION TRELLIS CODED MODULATION DECODER," by inventors Dojun Rhee and Chanthachith Souvanthong, which is assigned to the assignee of the present application and is incorporated herein by reference in its entirety.

FIELD OF THE INVENTION

The present claimed invention relates to cable modems. More particularly, the present claimed invention relates to quadrature amplitude modulation trellis coded modulation decoders.

BACKGROUND ART

Originally, cable networks were established to provide TV signals to a community that otherwise could not receive reliable TV signals. With subsequent addition of more channels, cable TVs have gained enormous popularity in the general segment as well. With the advent of the Internet and other digital communications, however, cable networks and channels have become a focus for transmitting digitized information at high speed and bandwidth. This is because a cable network can provide a high speed digital communication channel in addition to well known traditional cable services.

In cable networks, cable modems provide high speed data transporting functions between a cable network and a connected user. Cable modems typically implement a forward error correction (FEC) scheme. Prior Art FIG. 1 illustrates a conventional cable modem transmission block diagram 100 depicting an FEC scheme that complies with the standard of ITU-T Recommendation J-83 Annex B. The ITU-T Recommendation J-83 Annex B specifies using 64- and 256-quadrature amplitude modulation (QAM). The cable transmission block diagram 100 includes an FEC encoder 102, an FEC decoder 104, and a cable channel 106. The FEC encoder 102 encodes data using conventional FEC schemes for transmission to the FEC decoder 104 through the cable channel 106.

The FEC encoder 102 includes a Reed Solomon (RS) encoder 108, a convolutional interleaver 110, a randomizer 112 (e.g., scrambler), and a Trellis coded modulation (TCM) encoder 114. The RS encoder 108 sequentially receives 122 byte (i.e., symbol) packets with each byte containing 7 bits. Each packet contains 122 7-bit symbols or bytes. The RS encoder 108 adds six 7-bit redundancy bytes for correcting up to 3 symbol errors. The RS encoded 128 7-bit symbol packets are then transmitted to the interleaver 110 for convolutionally interleaving the symbols by modifying the order of the symbols in a packet. Convolutional interleaving is designed to reduce burst mode errors.

The interleaver 110 sequentially transmits the RS encoded and interleaved 128 7-bit symbol packets to the randomizer 112. The randomizer 112 adds a pseudorandom noise sequence of 7 bit symbols by performing bit-wise exclusive-OR operations to the symbols in an FEC frame (e.g., packet) to assure a random transmitted sequence. As used herein, an FEC frame refers to a packet that is processed in sequential fashion in the FEC encoder 102 and FEC decoder 104. The randomizer 112 thus provides even distribution of symbols in the constellation (e.g., 64 QAM, 256 QAM) to enable the modem to maintain proper phase lock during the transmission of data.

The randomized data packets, each of which includes 128 7-bit symbols, are then serially transmitted to the TCM encoder 114. As will be discussed below, the TCM encoder 114 adds redundancy to the data to improve the signal-to-noise ratio by increasing the symbol constellation without increasing the symbol rate. The TCM encoded data is then sent to the FEC decoder 104 over the cable channel 106. The conventional FEC encoder 102 including the RS encoder 108, the interleaver 110, the randomizer 112, and the TCM encoder 114 is known in the art and is described, for example, in a standard recommended by ITU-T (International Telecommunication Union) Recommendation J.83 entitled "Digital Multi-Programme Systems for Television Sound and Data Services for Cable Distribution," which is incorporated herein by reference in its entirety. For example, the ITU-T Recommendation J.83 specifies a single chip 64/256-QAM TCM encoder, which may be used to encode the inner code for a concatenated decoding scheme of North American cable modem.

The FEC decoder 104 includes a TCM decoder 116, a de-randomizer 118, a convolutional de-interleaver 120, and an RS decoder 122. The TCM decoder 116 receives the data serially from the FEC encoder 102 via the cable channel 106 and decodes the TCM encoded data. The TCM decoded data is then transmitted to the de-randomizer 118 and de-randomizes the symbols in the 128 7-bit symbol packets. After de-randomizing, the convolutional de-interleaver 120 receives the de-randomized data and de-interleaves the symbols in the 128 7-bit symbol packets. The de-interleaver 120 then transmits the de-interleaved data to the RS decoder 116.

The RS decoder 116 decodes the received data by performing RS error detection and correction on the received data. This RS decoding removes the 6 7-bit redundancy symbols added by the RS encoder 108 and thereby generates the original MPEG framed data of 122 7-bit symbol or byte packets as output.

The concatenated FEC coding scheme described in the ITU-T standard employs trellis coding for the inner code. The use of the trellis coding introduces redundancy to improve the signal-to-noise ratio by increasing the symbol constellation without increasing the symbol rate. Such coding is referred to as "trellis coded modulation" or "TCM" for short.

Prior Art FIG. 2A illustrates a block diagram of a conventional TCM encoder 114. The TCM encoder 114 of Prior Art FIG. 2 is a 64-QAM TCM encoder, which encodes a group of four RS encoded symbols into five consecutive 64-QAM symbols for mapping into five consecutive 64 QAM signals. The 64-QAM TCM encoder 114 serially receives 128 7-bit FEC frames (e.g., packets). A parser 202 identifies a group of four 7-bit symbols as RS1, RS2, RS3, and RS4 and assigns the symbols RS1 and RS2 as in-phase "I" component and assigns the symbols RS3 and RS4 as quadrature "Q" component. The symbol RS1 includes seven bits $I_0, I_1, I_2, I_3, I_4, I_5$, and $I_6$; the symbol RS2 includes bits $I_7, I_8, I_9, I_{10}, I_{11}, I_{12}$ and $I_{13}$; RS3 includes 7 bits $Q_0, Q_1, Q_2, Q_3, Q_4, Q_5$, and $Q_6$; and RS4 includes bits $Q_7, Q_8, Q_9, Q_{10}, Q_{11}, Q_{12}$, and $Q_{13}$. Since each symbol contains 7 bits, the total number of input bits for the four symbols is 28 bits with 14 bits each for I and Q symbols.

In this parsing scheme, the parser 202 assigns the individual bits of the I and Q symbols RS symbols into two groups as follows: two upper or most significant uncoded bit streams 212 and 214 and one lower or least significant bit coded bit stream 206 and 208. For the I component, the parser 202 outputs two upper uncoded bit streams 212: one stream including bits $I_1$, $I_4$, $I_7$, $I_{10}$, and $I_{12}$, and the other stream including bits $I_2$, $I_5$, $I_8$, $I_{11}$, and $I_{13}$. For the lower coded bit stream 216 of the I component, the parser 202 outputs the bits $I_0$, $I_3$, $I_6$, and $I_9$ for transmission to a differential encoder 204.

Likewise, for the Q component, the parser 202 outputs two upper uncoded bit streams 214: one stream including bits $Q_1$, $Q_4$, $Q_7$, $Q_{10}$, and $Q_{12}$, and the other stream including bits $Q_2$, $Q_5$, $Q_8$, $Q_{11}$, and $Q_{13}$. For the lower coded bit stream 218 of the Q component, the parser 202 outputs the bits $Q_0$, $Q_3$, $Q_6$, and $Q_9$ for transmission to the differential encoder 204. The two upper uncoded bit streams 212 and 214 of I and Q components are transmitted to a 64-QAM mapper 210.

With reference still to Prior Art FIG. 2A, the differential encoder 204 receives the lower streams 216 and 218 of I and Q components in sequence and performs a 90 degree rotationally invariant trellis coding for each corresponding pair of I and Q bits as received. Specifically, the differential encoder 204 performs the rotationally invariant trellis coding for the I and Q bit pairs as they are received as follows: $I_0$ and $Q_0$, $I_3$ and $Q_3$, $I_6$ and $Q_6$, and $I_9$ and $Q_9$. This allows the information to be carried by the change in phase, rather than by the absolute phase. The differential encoder 204 then transmits the differentially encoded lower stream I and Q components to a pair of punctured binary convolutional encoders 206 and 208, respectively.

The punctured binary convolutional encoders 206 and 208 are rate ½ binary convolutional encoders and convolutionally encodes redundancy into the least significant bits of the I and Q symbols to improve signal-to-noise gain. The convolutional encoders 206 and 208 are 16-state non-systematic ½ rate encoders with the generator: G1=010 101 and G2=011 111 (25, 37)octal. This generator is equivalent to the generator matrix $[1 \oplus D^2 \oplus D^4, 1 \oplus D \oplus D^2 \oplus D^3 \oplus D^4]$, where D represents a delay element "$Z^{-1}$." The ½ rate encoder generates 8 output bits from the four input bits for each lower I and Q component streams 216 and 218.

The 8 output bits are fed into a puncture matrix: 0001 1111, where "0" denotes NO transmission and "1" represents transmission of the output signal. The puncture matrix essentially converts the rate ½ encoder to rate ⅘ to produce a single serial bit stream of 5 bits. Accordingly, the punctured binary convolutional encoders 206 and 208 encodes the 4 bits of the lower I and Q bit streams 216 and 218, respectively, to generate 5 coded bits of $I_0'$, $I_1'$, $I_2'$, $I_3'$, and $I_4'$ as the convolutionally encoded lower I stream 220 and 5 coded bits of $Q_0'$, $Q_1'$, $Q_2'$, $Q_3'$, and $Q_4'$ as the convolutionally encoded lower Q stream 222. Since the TCM encoder 114 encodes a trellis group of 28 input bits to generate 30 bits, the overall trellis coded modulation of the 64-QAM TCM encoder 114 yields a 28/30 rate.

The 64 QAM mapper 210 receives two upper streams 212 and 214 and one lower streams of the I and Q components for a total of six streams. Each of the streams includes 5 serial data bits. Since I and Q includes 3 data streams, both I and Q streams can be used to define 3 bits of data at any one time. For example, the bits $I_0'$, $I_1$, and $I_2$ define an I component while the bits $Q_0'$, $Q_1$, and $Q_2$ define a Q component.

The 3 bits of I and Q components can then used in a double mapping process to generate a QAM signal. Specifically, using the 3 bits of I and Q components as indices to a look-up table, the 64-QAM mapper 210 determines a QAM symbol defined by "X" and "Y" components. Each of the "X" and "Y" components is 3 bits and represent 8-PAM signal constellation. Prior Art FIG. 2B illustrates a 64-QAM table that can be used to generate the X and Y values. The TCM encoder 114 may also include a QAM constellation mapper to generate a QAM signal. That is, the QAM constellation mapper can use the X and Y components as indices to a 64 QAM constellation mapping table to generate a corresponding QAM signal. Prior Art FIG. 2C depicts a 64-QAM constellation mapping table. Given the five consecutive bits in each of the streams 212, 214, 220, and 222 of the I and Q components, this double mapping process generates 5 consecutive QAM signals corresponding to the 5 consecutive QAM symbols.

In addition to the 64-QAM encoding, the ITU-T Recommendation also specifies utilizing a 256-QAM encoding in the cable modem specification. Prior Art FIG. 3A illustrates a block diagram of a conventional 256-QAM TCM encoder 300. Unlike the 64-QAM TCM encoder, which encodes 4 symbols of 28 bits, the 256-QAM TCM encoder 300 encodes a trellis group of 38 bits into five consecutive 256-QAM symbols for mapping into five consecutive 64 QAM signals. The 256-QAM TCM encoder encodes the 38 input bits into 5 consecutive QAM symbols and signals.

The 256-QAM TCM encoder 300 serially receives 128 7-bit FEC frames (e.g., packets). A parser 302 identifies a trellis group of 38 bits and assigns 19 bits as in-phase "I" component and the remaining 19 bits as quadrature "Q" component. The trellis group of 38 bits may either be in a non-sync trellis group bit order as indicated in row 304 or a sync trellis group bit order as indicated in row 306. To form a trellis group from RS codeword symbols, the parser 302 serializes the RS symbol bits beginning with the most significant bits of the first symbol of the first RS codeword following the frame sync. Bits are then placed in trellis group locations from RS symbols in the order as indicated in rows 304 or 306. For the sync trellis group, RS bits begin at location $I_1$ instead of $I_0$.

In this parsing scheme, the parser 302 assigns the individual bits of the I and Q symbols RS symbols into two groups as follows: three upper or most significant uncoded bit streams 308 and 310 and one lower or least significant bit coded bit stream 312 and 314. For the I component, the parser 302 outputs three upper uncoded bit streams 308: one stream including bits $I_3$, $I_7$, $I_{11}$, $I_{15}$, and $I_{18}$, another stream including bits $I_2$, $I_6$, $I_{10}$, $I_{14}$, and $I_{17}$, and the remaining stream including bits $I_1$, $I_5$, $I_9$, $I_{13}$, and $I_{16}$. For the lower coded bit stream 312 of the I component, the parser 302 outputs the bits $I_0$, $I_4$, $I_8$, and $I_{12}$ for transmission to a differential encoder 316. In case of the sync trellis group, the lower coded I component bit stream 312 includes $S_0$, $S_2$, $S_4$, and $S_6$.

Similarly for the Q component, the parser 302 outputs three upper uncoded bit streams 310: one stream including bits $Q_3$, $Q_7$, $Q_{11}$, $Q_{15}$, and $Q_{18}$, another stream including bits $Q_2$, $Q_6$, $Q_{10}$, $Q_{14}$, and $Q_{17}$, and the remaining stream including bits $Q_1$, $Q_5$, $Q_9$, $Q_{13}$, and $Q_{16}$. For the lower coded bit stream 314 of the Q component, the parser 302 outputs the bits $Q_0$, Q4, $Q_8$, and $Q_{12}$ for transmission to the differential encoder 316. In the case of the sync trellis group, the lower coded Q component bit stream 314 includes bits $S_1$, $S_3$, $S_5$, and $S_7$. The three upper uncoded bit streams 308 and 310 of I and Q components are transmitted to a 256-QAM mapper 318.

With reference still to Prior Art FIG. 3A, the differential encoder 316 receives the lower streams 312 and 314 of I and Q components in sequence and performs a 90 degree rotationally invariant trellis coding for each corresponding pair of I and Q bits as received. Specifically, the differential encoder 316 performs the rotationally invariant trellis coding for the I and Q bit pairs as they are received as follows: $I_0$ and $Q_0$, $I_4$ and $Q_4$, $I_8$ and $Q_8$, and $I_{12}$ and $Q_{12}$ for a non-sync trellis group bit order and $S_0$ and $S_1$, $S_2$ and $S_3$, $S_4$ and $S_5$, and $S_6$ and $S_7$ for a sync trellis group bit order. This allows the information to be carried by the change in phase, rather than by the absolute phase. The differential encoder 316 then transmits the differentially encoded lower stream I and Q components to a pair of punctured binary convolutional encoders 320 and 322, respectively.

The punctured binary convolutional encoders 320 and 322 are rate ½ binary convolutional encoders and convolutionally encodes redundancy into the least significant bits of the I and Q symbols to improve signal-to-noise gain. The convolutional encoders 320 and 322 are 16-state non-systematic ½ rate encoders with the generator: G1=010 101 and G2=011 111 (25, 37)octal. This generator is equivalent to the generator matrix $[1 \oplus D^2 \oplus D^4, 1 \oplus D \oplus D^2 \oplus D^3 \oplus D^4]$, where D represents a delay element "$Z^{-1}$." The ½ rate encoder generates 8 output bits from the four input bits for each I and Q component streams 312 and 314.

The 8 output bits are then fed into a puncture matrix: 0001 1111, where "0" denotes NO transmission and "1" represents transmission of the output signal. The puncture matrix essentially converts the rate ½ encoder to rate ⅘ to produce a single serial bit stream of 5 bits. Accordingly, the punctured binary convolutional encoders 320 and 322 encodes the 4 bits of the lower I and Q bit streams 216 and 218, respectively, to generate 5 coded bits of $I_0'$, $I_1'$, $I_2'$, $I_3'$, and $I_4'$ as the convolutionally encoded lower I stream 324 and 5 coded bits of $Q_0'$, $Q_1'$, $Q_2'$, $Q_3'$, and $Q_4'$ as the convolutionally encoded lower Q stream 326. Since the TCM encoder 300 encodes a trellis group of 38 input bits to generate 40 bits, the overall trellis coded modulation of the 256-QAM TCM encoder 300 yields a 38/40 rate.

The 256 QAM mapper 318 receives three upper streams 308 and 310 and the lower streams 324 and 326 of the I and Q components for a total of six streams. Each of the streams includes 5 serial data bits. Since I and Q each includes 4 data streams, both I and Q streams can be used to define 4 bits of data at any one time. For example, the bits $I_0'$, $I_1$, $I_2$, and $I_3$ define an I component while the bits $Q_0'$, $Q_1$, $Q_2$, and $Q_3$ define a Q component.

The 4 bits of I and Q components can then used in a double mapping process to generate a QAM signal. Specifically, using the 4 bits of I and Q components as indices to a look-up table, the 256-QAM Mapper 318 determines an 8-bit QAM symbol defined by "X" and "Y" components. Each of the "X" and "Y" components is 4 bits and represents 16-PAM signal constellation. Prior Art FIG. 3B illustrates a 256-QAM table that can be used to generate the X and Y values. The TCM encoder 300 may also include a QAM constellation mapper 328 to generate a QAM signal. That is, the QAM constellation mapper 328 can use the X and Y components as indices to a 256 QAM constellation mapping table to generate a corresponding QAM signal. Prior Art FIG. 3C depicts a 256-QAM constellation mapping table. Given the five consecutive bits in each of the streams 308, 310, 324, and 326 of the I and Q components, this double mapping process generates 5 consecutive QAM signals corresponding to the 5 consecutive 8-bit QAM symbols.

Conventional techniques and apparatus for decoding the 64/256-QAM TCM encoded data stream would typically require direct product of two 8-state trellis and two 16-state trellis for 64- and 256-QAM TCM encoded data, respectively. This is because both the quadrature and in-phase components of demodulated 64/256-QAM signals are needed to compute the squared Euclidian distance. Hence, the conventional technique and apparatus requires the use of a heavily connected 64 or 256-state trellis, resulting in complex trellis and branch metric processing.

Thus, what is needed is an apparatus and method for decoding the 64/256-QAM TCM encoded data stream using less trellis and branch metrics.

SUMMARY OF THE INVENTION

Broadly speaking, the present invention fills these needs by providing a 64/256 QAM TCM decoder. It should be appreciated that the present invention can be implemented in numerous ways, including as a process, an apparatus, a system, a device, or a method. Several inventive embodiments of the present invention are described below.

In one embodiment, the present invention provides a quadrature amplitude modulation (QAM) trellis coded modulation (TCM) decoder for decoding a stream of QAM TCM signals. Each of the signals has a plurality of associated branch metrics and has an in-phase component and a quadrature component. The in-phase component is defined by a plurality of in-phase symbols and the quadrature component is defined by a plurality of quadrature symbols. The QAM TCM decoder includes a first Viterbi decoder and a second Viterbi decoder. The first Viterbi decoder is configured to receive an in-phase component of a QAM TCM signal for decoding the associated in-phase symbols into an in-phase decoded bit and a plurality of uncoded in-phase bits. The second Viterbi decoder configured to receive a quadrature component of the QAM TCM signal for decoding the associated quadrature symbols into a quadrature decoded bit and a plurality of uncoded quadrature bits. The QAM TCM decoder is preferably configured to decode 64- or 256-QAM TCM signals.

In another embodiment, the present invention provides a method for decoding a stream of QAM TCM signals to generate decoded in-phase and quadrature bits and a plurality of uncoded in-phase and quadrature bits. Each of the signals has a plurality of associated branch metrics, and each signal has an in-phase component and a quadrature component. The in-phase component is defined by a plurality of in-phase symbols and the quadrature component is defined by a plurality of quadrature symbols. The method comprises: a) receiving a stream of QAM TCM signals; b) demodulating each of the QAM TCM signals into an in-phase component and a quadrature component; c) receiving an in-phase component of a QAM TCM signal; d) receiving a quadrature component of the QAM TCM signal; e) generating an in-phase decoded bit and a plurality of uncoded in-phase bits by decoding the associated in-phase symbols; and f) generating a quadrature decoded bit and a plurality of uncoded quadrature bits by decoding the associated quadrature symbols.

In yet another embodiment, a QAM TCM decoder for decoding a stream of QAM TCM signals is disclosed. Each of the signals has a plurality of associated branch metrics, and each signal has an in-phase component and a quadrature component. The in-phase component is defined by a plurality of in-phase symbols and the quadrature component is defined by a plurality of quadrature symbols. The QAM TCM decoder includes a first decoding means and a second decoding means. The first decoding means is configured to receive an in-phase component of a QAM TCM signal for decoding the associated in-phase symbols into an in-phase decoded bit and a plurality of uncoded in-phase bits. The second decoding means configured to receive a quadrature component of the QAM TCM signal for decoding the associated quadrature symbols into a quadrature decoded bit and a plurality of uncoded quadrature bits. The first and second decoding means are adapted to decode 64- or 256-QAM TCM signals.

Advantageously, the 64/256-QAM TCM decoder of the present invention provides the benefit of decoding in-phase and quadrature components independently and separately. Since in-phase and quadrature component of 64/256-QAM TCM code can be decoded independently, the present invention reduces branch metric calculation and trellis complexity. In addition, the TCM decoder of the present invention can decode 64- or 256-QAM TCM signals. Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

Prior Art

Prior Art

Prior Art FIG. 3B illustrates a 256-QAM table that can be used to generate the X and Y values.

Prior Art FIG. 3C depicts a 256-QAM constellation mapping table.

DESCRIPTION OF THE PREFERRED EMBODIMENTS

In the following detailed description of the present invention, a 64/256-QAM TCM decoder, numerous specific details are set forth in order to provide a thorough understanding of the present invention. However, it will be obvious to one skilled in the art that the present invention may be practiced without these specific details. In other instances, well known methods, procedures, components, and circuits have not been described in detail so as not to unnecessarily obscure aspects of the present invention.

Figure 1:
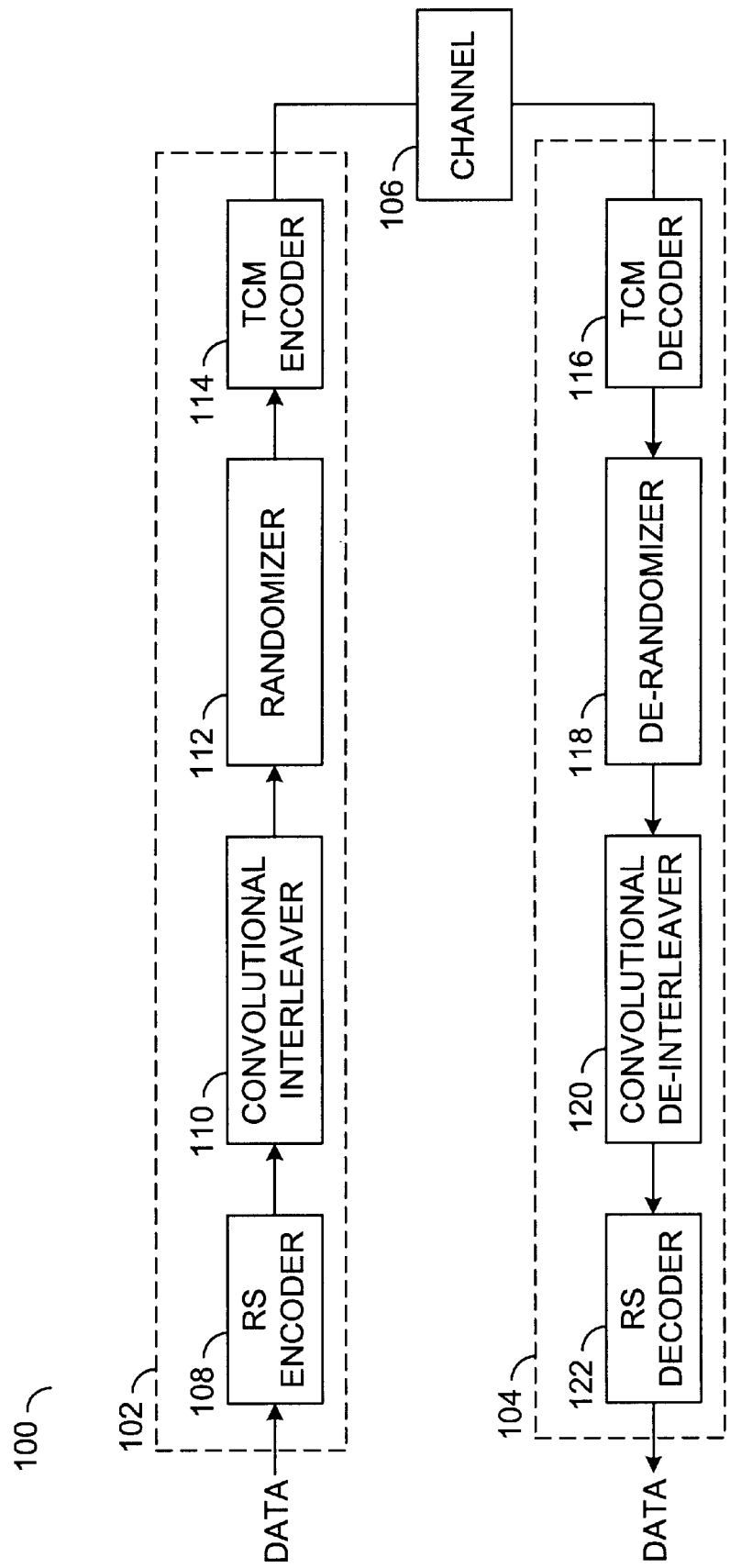
FIG. 1 illustrates a conventional cable modem transmission block diagram depicting a forward error correction (FEC) scheme in accordance with standard of ITU-T Recommendation J-83 Annex B.
Figure 2A:
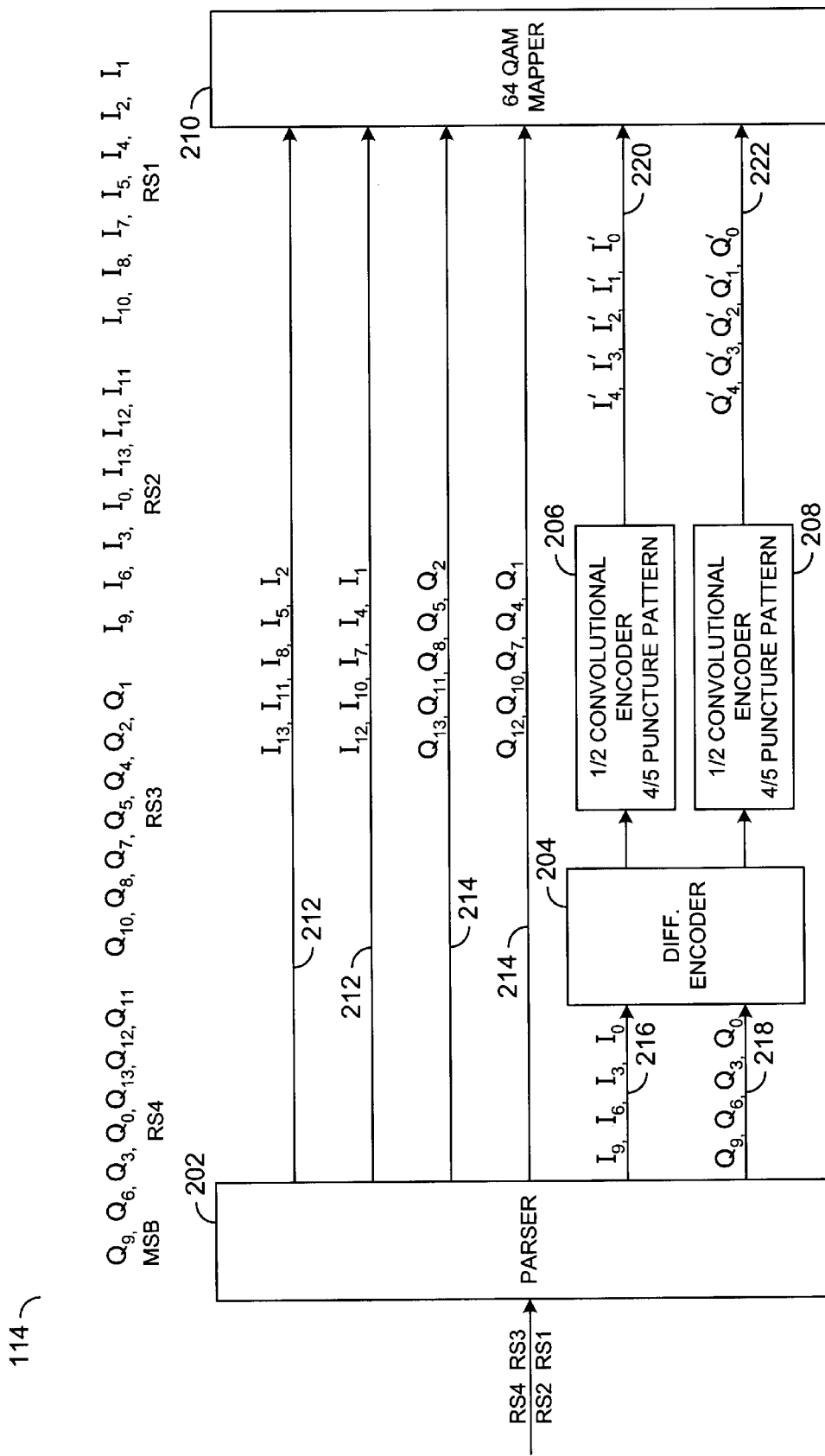
FIG. 2A illustrates a block diagram of a conventional TCM encoder.
Figure 2B:
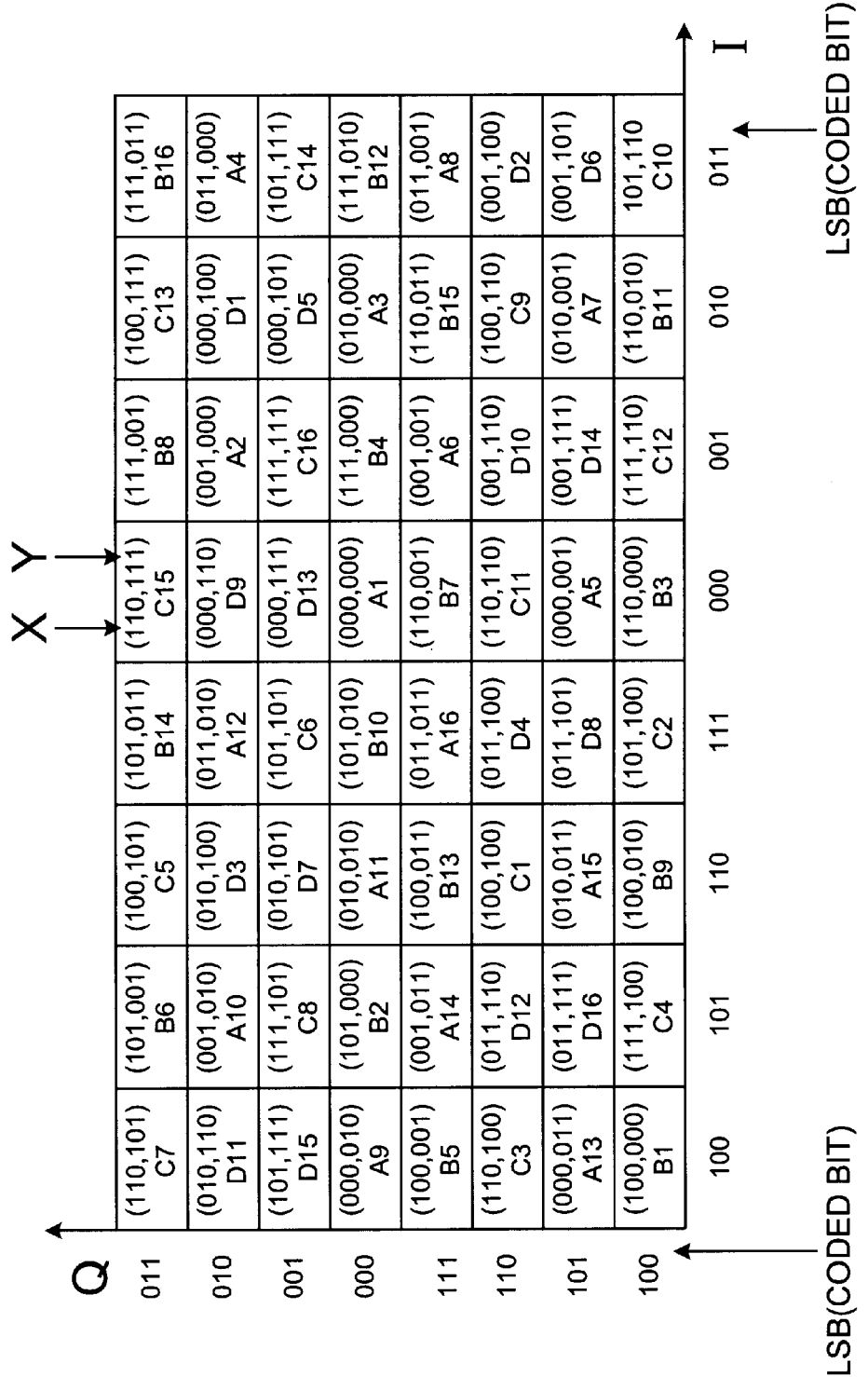
FIG. 2B illustrates a 64-QAM table that can be used to generate the X and Y values.
Figure 2C:
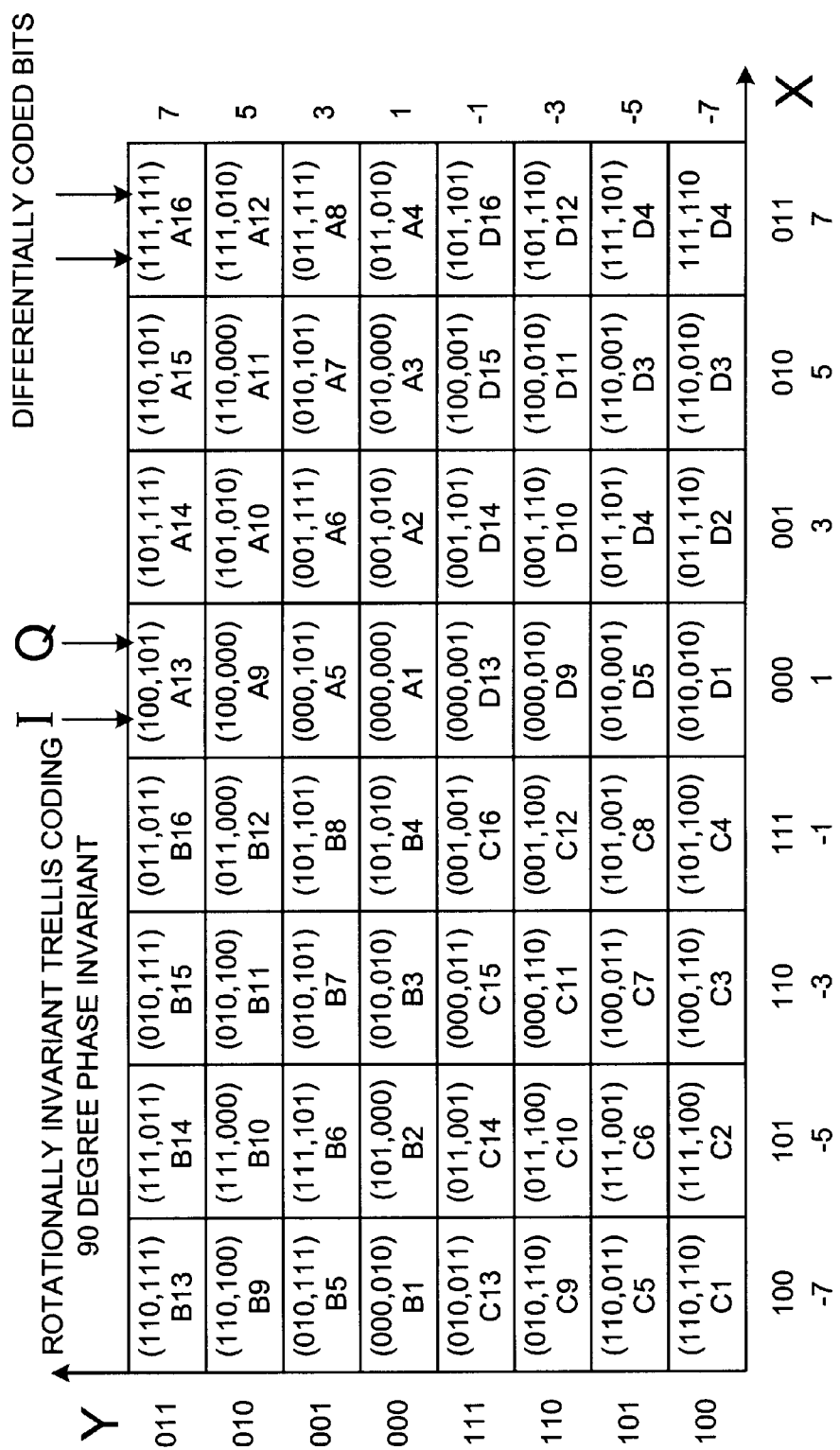
FIG. 2C depicts a 64-QAM constellation mapping table.
Figure 3A:
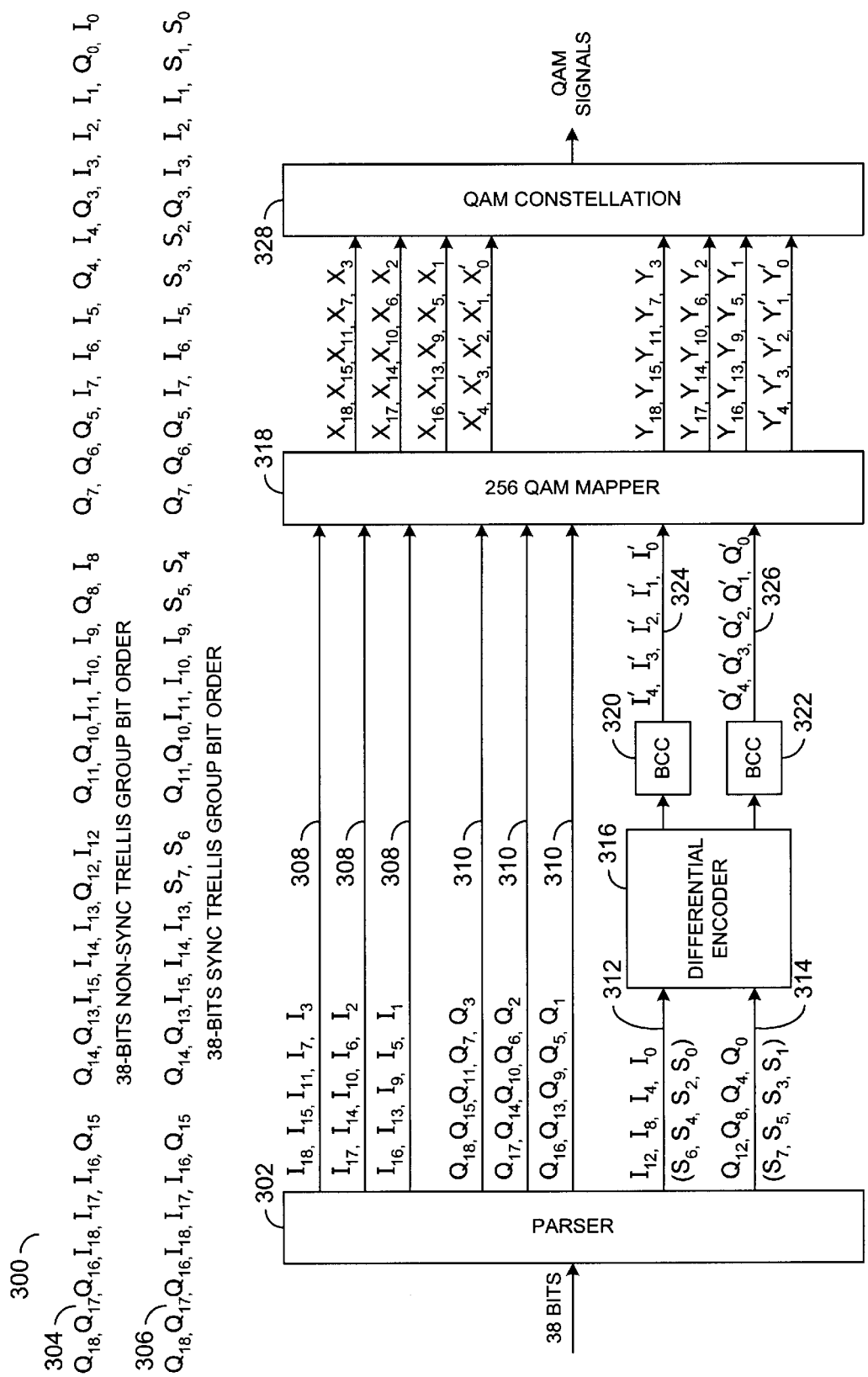
FIG. 3A illustrates a block diagram of a conventional 256-QAM TCM encoder.
Figure 4A:
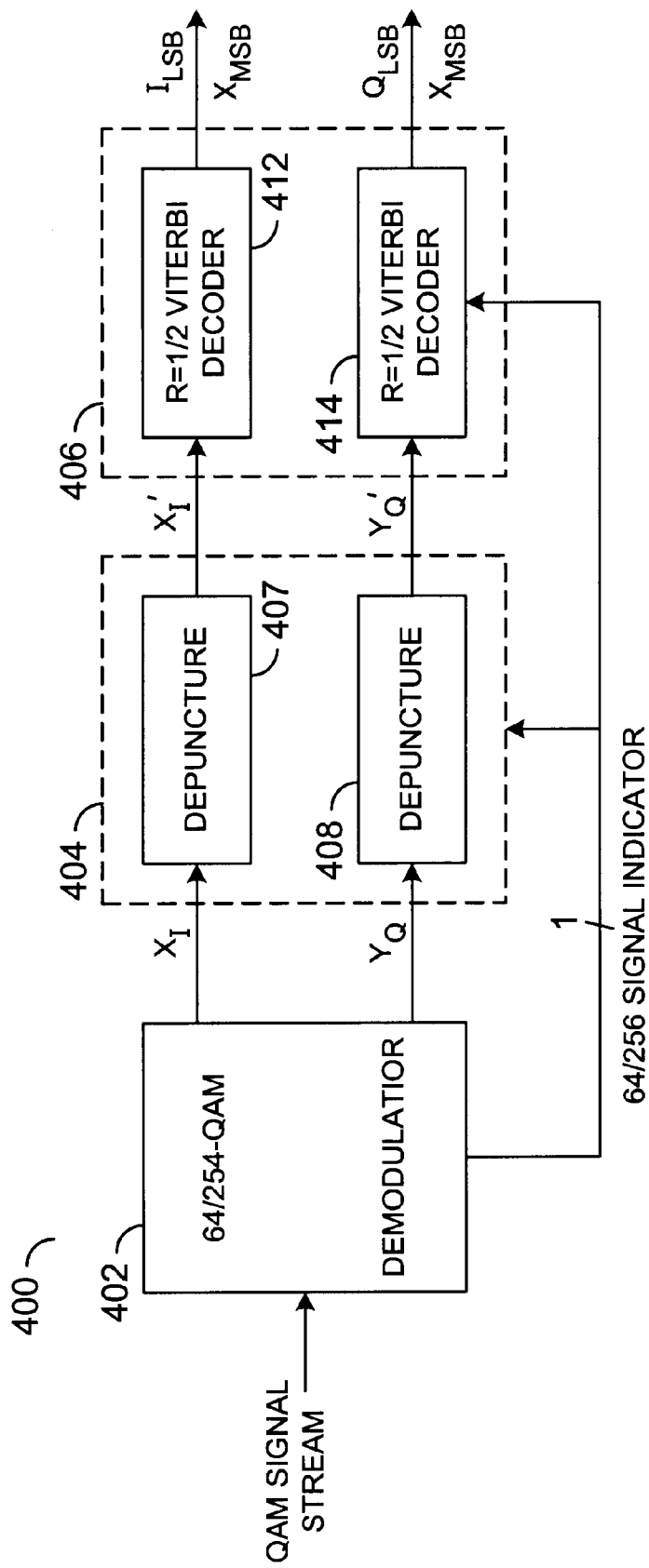
FIG. 4A illustrates a block diagram of a 64/256 QAM TCM decoder in accordance with one embodiment of the present invention.

The present invention provides a 64/256-Quadrature Amplitude Modulation (QAM) Trellis Coded Modulation (TCM) decoder, which may be used as the inner code for a concatenated decoding scheme of North American cable modem. FIG. 4A illustrates a block diagram of a 64/256 QAM TCM decoder 400 in accordance with one embodiment of the present invention. The 64 QAM TCM decoder 400 includes a 64/256 QAM demodulator 402, a depuncture circuitry 404, and a rate-½ Viterbi decoder 406. In this configuration, the 64/256-QAM demodulator 402 receives an analog 64- or 256-QAM signal stream through a cable network and determines whether the received signal is a 64- or 256-QAM signal. In the preferred embodiment, the 64/256-QAM demodulator generates a 1-bit indicator signal for indicating whether the received signal is a 64- or 256-QAM signal and transmits the QAM indicator signal to other parts of the circuitry such as the depuncture circuitry 404 and the Viterbi decoder 406.

In this configuration, the QAM demodulator 402 receives a stream of QAM signals and demodulates the received QAM signals into an in-phase component $X_I$ and a quadrature component $Y_Q$. In a preferred embodiment, the QAM demodulator 402 receives five consecutive signals (e.g., $S_0$, $S_1$, $S_2$, $S_3$, $S_4$) and demodulates the signals into in-phase component $X_I$ and quadrature component $Y_Q$ of five consecutive in-phase and quadrature symbols each, respectively. For example, the in-phase component $X_I$ includes five consecutive in-phase symbols (e.g., $X_0, X_1, X_2, X_3, X_4$). The quadrature component $Y_Q$ includes five consecutive quadrature symbols (e.g., $Y_0, Y_1, Y_2, Y_3, Y_4$).

The depuncture circuitry 404 receives the five consecutive in-phase and quadrature symbols in parallel and generates a depunctured in-phase component $X_1'$ and a depunctured quadrature component $Y_Q'$. Preferably, the depuncture circuitry 404 depunctures $X_I$ and $Y_Q$ in accordance with a de-puncture matrix such as [P1,P2]=[0001:1111], where "0" indicates no transmission and "1" denotes transmission. Under the exemplary depuncturing scheme, the depuncture circuitry 407 generates the in-phase component $X_I'$ of [*, *, *, $X_0$: $X_4$, $X_3$, $X_2$, $X_1$] and the depuncture circuitry 408 produces the quadrature component $Y_Q'$ of [*, *, *, $Y_0$: $Y_4$, $Y_3, Y_2, Y_1$], wherein * denotes a dummy variable. The eight consecutive in-phase component $X_I'$ and quadrature component $Y_Q'$ symbols are then transmitted pair wise in parallel to the Viterbi decoder 406. For example, the symbols $X_0$ and $X_1$ are transmitted pair wise in parallel to the Viterbi decoder 406 for simultaneous processing. Similarly, the symbols $Y_0$ and $Y_1$ are transmitted pair wise for processing by the Viterbi decoder 406.

In accordance with the de-puncture matrix, the depuncture circuitry 404 adds or inserts 3 dummy symbols (e.g., *) to each of the received five consecutive symbols of $X_I$ and $Y_Q$ components and essentially converts the rate ⅘ soft output stream into rate ½ output stream. In this way, the in-phase and quadrature depuncture circuitry 407 and 408 generate a depunctured soft in-phase and quadrature outputs $X_I'$ and $Y_Q'$, respectively, for transmission to the Viterbi decoder 406.

The Viterbi decoder 406 includes an in-phase Viterbi decoder 412 and a quadrature Viterbi decoder 414. The in-phase Viterbi decoder 412 receives the in-phase component $X_I'$ and generates a decoded in-phase (e.g., $I_{LSB}$) bit and uncoded bits or MSBs of the in-phase component (i.e., $X_{MSB}$). The quadrature Viterbi decoder 414 receives the quadrature component $Y_Q'$ and generates a decoded quadrature (e.g., $Q_{LSB}$) bit and uncoded bits or MSBs of the quadrature component (i.e., $Y_{MSB}$) for each pair of symbols received. In a preferred embodiment, the in-phase Viterbi decoder 412 receives four consecutive pairs of in-phase component $X_I'$ and generates four consecutive decoded in-phase (e.g., $I_{LSB}$) bits and uncoded bits or MSBs of the in-phase component (i.e., $X_{MSB}$). Likewise, the quadrature Viterbi decoder 414 preferably receives four consecutive pairs of quadrature component $Y_Q'$ and generates a decoded quadrature (e.g., $Q_{LSB}$) bit and uncoded bits or MSBs of the quadrature component (i.e., $Y_{MSB}$) for each pair of symbols received. The Viterbi decoder 406 thus outputs in-phase component including $I_{LSB}$ and $X_{MSB}$ and quadrature component including $Q_{LSB}$ and $Y_{MSB}$.

Figure 4B:
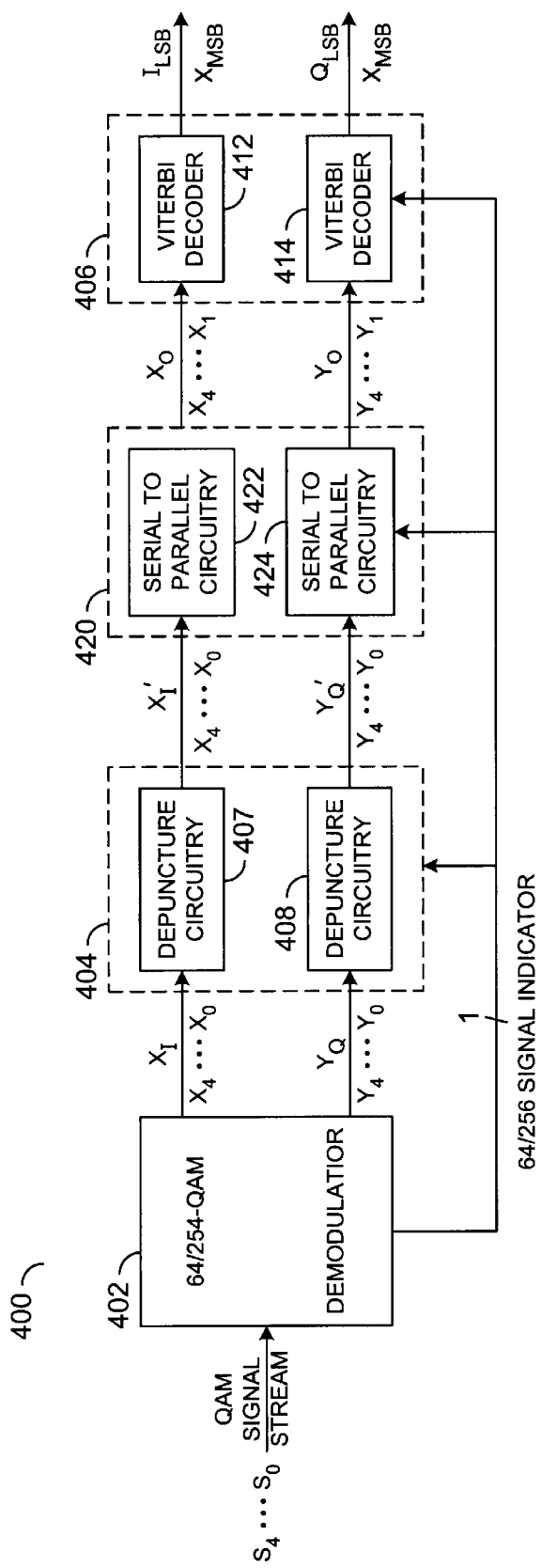
FIG. 4B illustrates a block diagram of the 64/256 QAM TCM decoder 400 including a serial-to-parallel circuitry.

FIG. 4B illustrates a block diagram of the 64/256 QAM TCM decoder 400 including a serial-to-parallel circuitry 420. The serial-to parallel circuitry 420 includes an in-phase serial-to-parallel circuitry 422 and a quadrature serial-to-parallel circuitry 424. The in-phase serial-to-parallel circuitry 422 is coupled to the in-phase depuncture circuitry 407 to receive the in-phase component $X_1'$ symbols for arranging the in-phase symbols from a serial into a parallel sequence for input into the in-phase Viterbi decoder 412. The quadrature serial-to-parallel circuitry 424 is coupled to the quadrature depuncture circuitry 408 to receive quadrature symbols $Y_Q'$ for arranging the quadrature symbols from a serial into a parallel sequence for input into the quadrature Viterbi decoder 414. Preferably, the in-phase and quadrature serial-to-parallel circuitry 422 and 424 receive eight consecutive in-phase and quadrature symbols, respectively and convert the symbols into four consecutive pairs of in-phase and quadrature symbols, respectively. The in-phase and quadrature serial-to-parallel circuitry 422 and 424 then transmit the four consecutive pairs of in-phase and quadrature symbols, respectively, in parallel into the in-phase and quadrature Viterbi decoders 412 and 414, respectively.

The Viterbi decoder 406 receives the depunctured in-phase and quadrature components from the depuncture circuitry 404 in parallel and decodes the soft in-phase and quadrature data streams from the 64/256-QAM demodulator 402 separately and independently. In a preferred embodiment, the Viterbi decoder 406 receives the four consecutive pairs of in-phase and quadrature symbols in parallel. The Viterbi decoder 406 preferably includes an in-phase Viterbi decoder 412 for decoding the in-phase component and a quadrature Viterbi decoder 414 for decoding the quadrature component. In this preferred configuration, the in-phase Viterbi decoder 412 receives the four consecutive in-phase component symbols while the quadrature Viterbi decoder 414 receives the four consecutive quadrature component symbols. Each of the Viterbi decoders 412 and 414 generates one coded information bit for convolutional code and 4 uncoded bits for 64-QAM signals or 6 uncoded bits for 256-QAM signals for the respective component of the data stream.

In one embodiment of the present invention, the Viterbi decoder 406 receives the indicator signal from the QAM demodulator 402, which indicates whether the received signals are 64- or 256-QAM modulated signals. In response to the indicator signal, the Viterbi decoder 406 decodes the received signals as either 64- or 256-QAM TCM signals. In particular, the Viterbi decoders 412 and 414 decode the in-phase and quadrature components, respectively, of the received signals in accordance with the indicator signal.

Figure 5A:
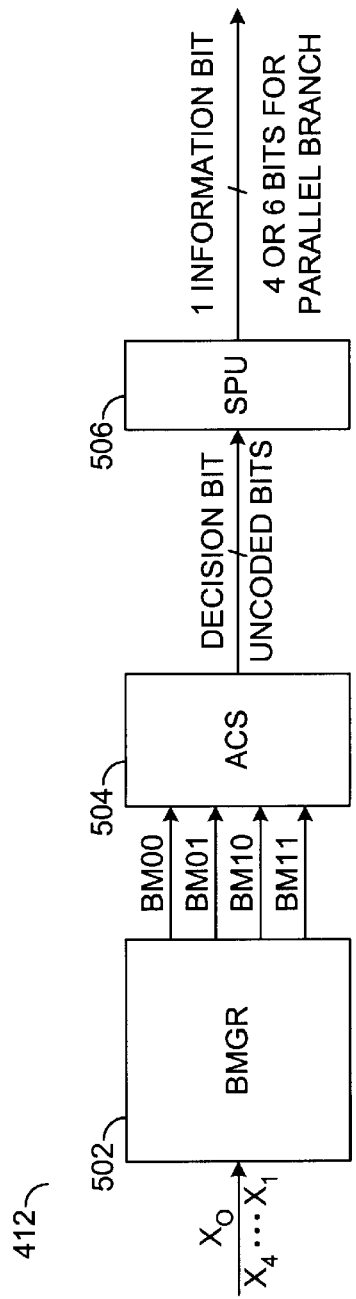
FIG. 5A illustrates a block diagram of the Viterbi decoder for decoding a 64/256-QAM TCM signal stream in accordance with one embodiment of the present invention.

FIG. 5A illustrates a block diagram of the Viterbi decoder 412 for decoding a 64/256-QAM TCM signal stream in accordance with one embodiment of the present invention. While FIG. 5A illustrates the Viterbi decoder 412, it should be appreciated that the Viterbi decoder 412 can also be utilized as the Viterbi decoder 414 in FIG. 4 to decode the quadrature components as well. In this embodiment, the Viterbi decoder 412 includes a branch metric generator 502, an add-compare-select circuitry 504 coupled to the branch metric generator 502, and a trace-back circuitry 506 coupled to the add-compare-select circuitry 504.

In the Viterbi decoder 412 configuration of FIG. 5A, the branch metric generator 502 receives in-phase components of a 64/256-QAM TCM signals and extracts the associated branch metrics. In a preferred embodiment, the Viterbi decoder 412 receives four consecutive pairs of in-phase component symbols. Since the TCM encoder uses a rate-½ 16-state convolutional code, each of the four branches in a 16-state trellis (i.e., 00, 01, 10, 11) has four distinct labels. Accordingly, only the branch metrics for these four distinct branch labels (e.g., BM00, BM01, BM10, and BM11) are computed. In this setting, two consecutive soft data bits are fed into the branch metric generator 502 because each distinct label has two bits.

These two bits are used as the least significant bits (LSBs) for representing, for example, 8-PAM signal constellation mapping, i.e., (−7, −5, −3, −1, 1, 3, 5, 7) in decoding 64-QAM signals. For each bit, four parallel branches with the most significant bits (MSBs) label (00, 01, 10, 11) exist. These four parallel branch labels are compared with four 8-PAM signal constellation, which are decided by LSB branch label.

For example, if "01" is a label for a branch in a rate-½ Viterbi decoder trellis, then, for label "0", the branch metrics with (000, 010, 100, 110)=(1, 5, −7, −3) in 8-PAM signal constellation can be determined. Similarly, a label with minimum branch metric can also be determined. On the other hand, for a label "1," the branch metrics with (001, 011, 101, 111)=(3, 7, −5, −1) in 8-PAM signal constellation can be evaluated. Likewise, a label with minimum branch metric can be determined. The branch metric generator 502 then adds each branch metric and stores a pair of two uncoded bits (e.g., MSBs) from stored labels with minimum branch metric. In this manner, the branch metric generator circuitry 502 determines the uncoded bits (e.g., MSBs) and minimum distance for each branch.

For 256-QAM signals on the other hand, the two bits are used as the LSBs for representing 16-PAM signal constellation mapping, i.e., (−15, −13, −11, −9, −7, −5, −3, −1, 1, 3, 5, 7, 9, 11, 13, 15) in decoding 256-QAM signals. There are eight parallel branches with the most significant bits (MSBs) label (000, 001, 010, 011, 100, 101, 110, 111). These eight parallel branch labels are compared with eight 16-PAM signal constellation, which are decided by LSB of branch label.

For instance, if "01" is a label for a branch in a rate-½ Viterbi decoder trellis, then, for label "0", the branch metrics with (0000, 0010, 0100, 0110, 1000, 1010, 1100, 1110)=(1, 5, 9, 13, −15, −11, −7, −3) in 16-PAM signal constellation can be determined. Similarly, a label with minimum branch metric can also be determined. On the other hand, for a label "1," the branch metrics with (0001, 0011, 0101, 0110, 1001, 1011, 1101, 1101)=(3, 7, 11, 13, −13, −9, −5, −1) in 16-PAM signal constellation can be evaluated. Likewise, a label with minimum branch metric can be determined. The branch metric generator 502 then adds each branch metric and stores a pair of three uncoded bits (e.g., MSBs) from stored labels with minimum branch metric. In this manner, the branch metric generator circuitry 602 determines the uncoded bits (e.g., MSBs) and minimum distance for each branch.

The add-compare-select circuitry 504 receives the uncoded bits and the minimum distances for each branch from the branch metric generator circuitry 502. The add-compare-select circuitry 504 then compares the branch metrics of each state label and determines the smallest branch metric for each state. The add-compare-select circuitry 504 then assigns a decision bit to the smallest branch metric. For each 64-QAM signal, the Viterbi decoder 412 thus generates the state decision bit and 4 uncoded bits in the case of 64-QAM signals or 6 uncoded bits for 256-QAM signals.

In this process, the add-compare-select circuitry 504 updates path metrics recursively. The add-compare-select circuitry 504 preferably includes a fixed add-compare-select unit for each state of trellis so that the Viterbi decoder 408 can select the minimum metric path between the two competing paths entering the state and store the path metric of the surviving path. Each of the add-compare-select unit is assigned to a unique state of the trellis, which is used as a label for the associated add-compare-select unit.

For rate-1/n codes, each add-compare-select unit receives path metrics from two add-compare-select units and sends the path metrics to two other add-compare-select units. Any two add-compare-select units with labels of the form 0X and 1X receive the path metrics from the same pair of add-compare-select units with labels X0 and X1, where X denotes either 1 or 0. The pair of add-compare-select units (0X, 1X) forms a hardware entity, which is referred to as a double-add-compare-select unit. The wiring between the add-compare-select units is isomorphic to the state diagram of the convolutional code. Using this scheme, the add-compare-select circuitry 504 generates and feeds 4 (for 64-QAM signals) or 6 (for 256-QAM signals) uncoded bits and a state decision bit to the trace-back circuitry.

The trace-back circuitry 506 uses the received decision bits to identify surviving paths for all states. In addition, the trace-back circuitry 506 determines a unique Maximum Likelihood (ML) path by tracing back all the surviving paths to their common root. The unique ML path is preferably determined by tracing back one single path down to coding depth levels. In the case of 64-QAM signals, the trace-back circuitry 506 generates eight consecutive 2-bit pairs for parallel branches and 4 information bits from 8 consecutive in-phase component of the 64-QAM signals. On the other hand, in the case of 256-QAM signals, the trace-back circuitry 506 generates eight consecutive 3-bit pairs for parallel branches and 4 information bits from 8 consecutive in-phase component of the 256-QAM signals.

The four recovered information bits are then fed into a binary convolutional encoder to produce 8 LSBs. These eight LSBs are combined with eight consecutive 2-bit pair for 64-QAM signals or 3-bit pair for 256-QAM signals and fed into a puncture circuitry to generate 5 consecutive 3-bit "X" components in the case of 64-QAM signals or 4-bit "X-components" in the case of 256-QAM signals. Five consecutive 3-bit or 4-bit quadrature "Y- components" are likewise generated by the Viterbi decoder 414 in a similar manner.

Figure 5B:
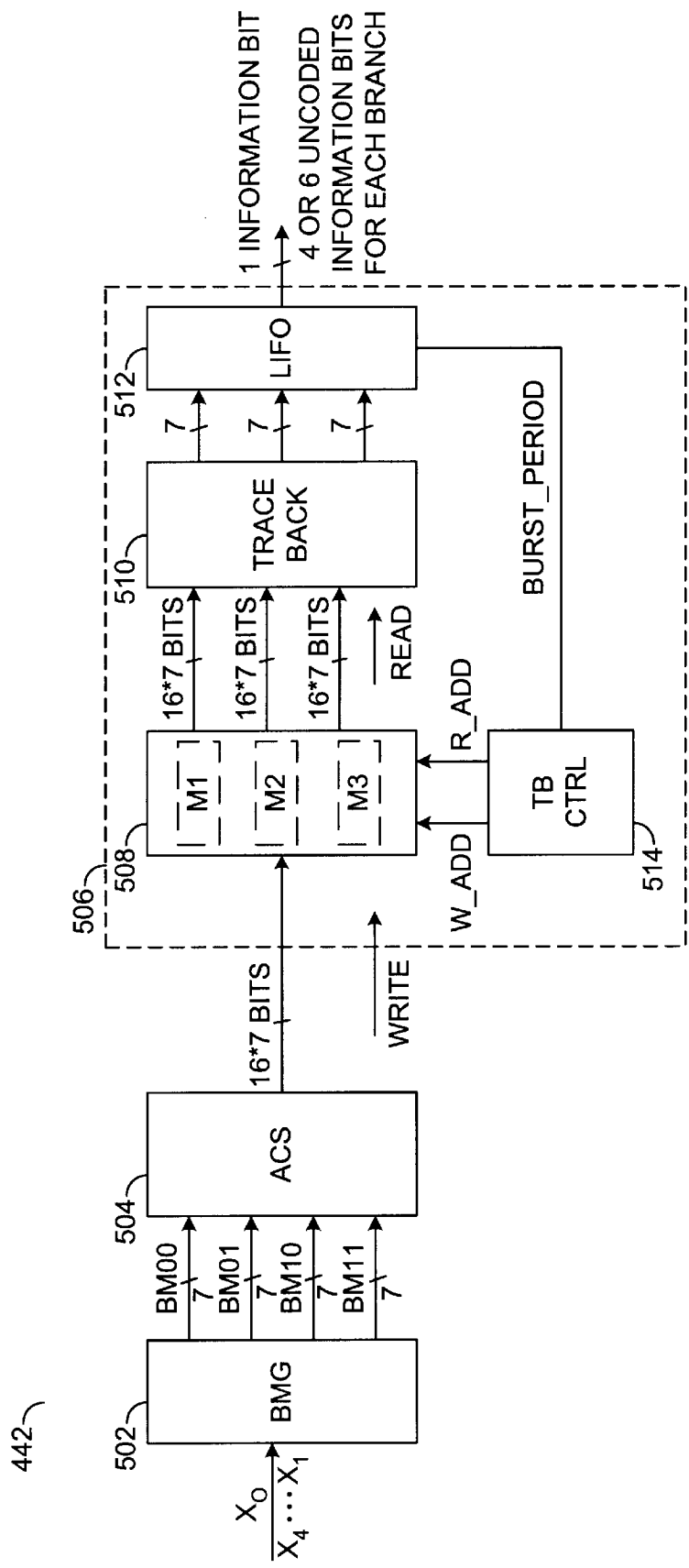
FIG. 5B illustrates a more detailed block diagram of the Viterbi decoder for decoding 64/256-QAM TCM signals in accordance with one embodiment of the present invention.

FIG. 5B illustrates a more detailed block diagram of the Viterbi decoder 412 for decoding 64/256-QAM TCM signals in accordance with one embodiment of the present invention. The trace-back circuitry 506 includes a storage unit 508, a trace-back unit 510, a last-in-first-out (FIFO) unit 512, and a trace-back controller 514. In this configuration, the branch metric generator 502 and the add-select-compare circuitry 504 perform the functions discussed previously. For example, the branch metric generator 502 generates and transmits branch metrics BM00, BM01, BM10, and BM11 to the add-compare-select circuitry 502 along with the uncoded bits. The add-compare-select circuitry 504 then compares the branches for each of the states and determines the branch with the smallest branch metric, which is assigned with a decision bit, as mentioned above in conjunction with FIG. 5A.

With continuing reference to FIG. 5B, the outputs of the add-compare-select circuitry 504 are stored in the storage unit 508 of the trace-back circuitry 506. Preferably, the storage unit 508 includes three random access memories (RAMs) M1, M2, and M3, each of which is (16×7)×32 or 112×32 bits to accommodate the larger memory requirements of 256-QAM signals, where 16 corresponds to 16 states, 7 corresponds to 6 uncoded bits and 1 information bit for 256-QAM signals, 32 corresponds to 24-read and 8-write operation for read-three-write-one mode. For 64-QAM signals, only 5 bits are required for 4 uncoded bits and 1 information bit. Accordingly, when 64-QAM signals are processed, only (16×5)×32 or 80×32 bit block of the 112×32 bit block can be utilized to accommodate the lesser memory requirements of the 64-QAM signals.

Using three RAMs M1, M2, and M3 in this memory configuration, the add-compare-select circuitry 504 writes once into a RAM and the trace-back circuitry 506 reads three times from the RAMs M1, M2, and M3 of the storage unit 508. In these read and write operations, the trace-back controller 514 provides the write and read addresses. The trace-back unit 510 preferably traces back three consecutive 16 states at a time and outputs one information bit, which is equivalent to the LSB of the current state, and the uncoded information bits. The trace-back circuitry 506 preferably utilizes trace back depth of 72 based on index η of 3 and coding depth of 48.

The trace-back unit 510 writes 1 decoded bit and MSBs into the LIFO 512. In a preferred embodiment, the LIFO 512 receives three symbols in parallel. In this LIFO configuration, writing to the LIFO 512 takes 24 clock cycles and reading from the LIFO 512 takes 24 clock cycles. However, only 24 symbols on 72 input symbols are read due to the coding depth of 48 symbols. Eventually, the next valid data is ready to be written into the LIFO 512 after 24 clock cycles. The trace-back controller 514 controls the burst input/output of the LIFO 512 by transmitting a burst period signal.

Figure 6A:
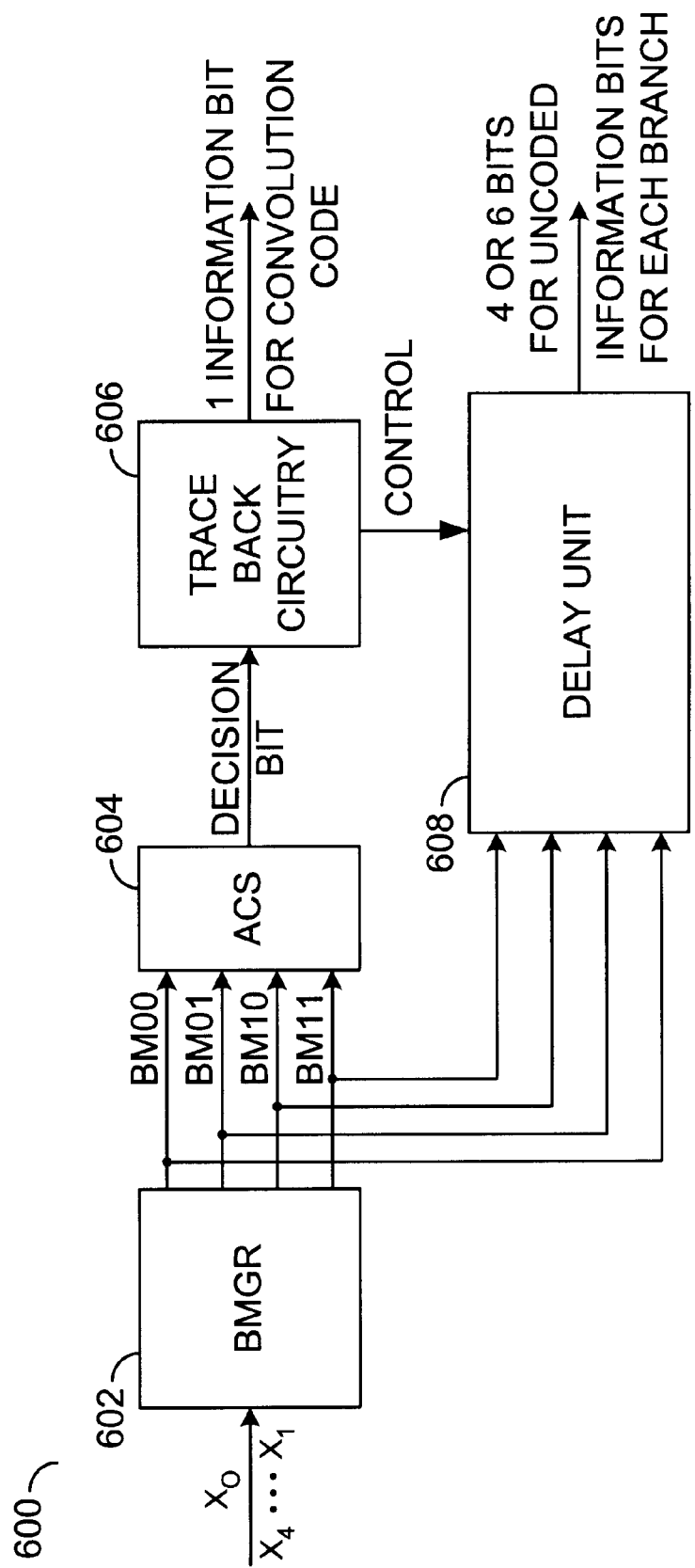
FIG. 6A illustrates a block diagram of a Viterbi decoder for decoding 64/256-QAM TCM signals in accordance with an alternative embodiment of the present invention.

FIG. 6A illustrates a block diagram of a Viterbi decoder 600 for decoding 64/256-QAM TCM signals in accordance with another embodiment of the present invention. It should be appreciated that the Viterbi decoder 600 can be employed as the Viterbi decoders 412 and 414 in FIG. 4 to decode the in-phase and quadrature components. Similar to the Viterbi decoder 412 illustrated in FIGS. 5A and 5B, the Viterbi decoder 600 includes a branch metric generator 602, an add-compare-select circuitry 604, and a trace-back circuitry 606. In contrast to the Viterbi decoder 412 however, the Viterbi decoder 600 also includes a delay unit 608. The delay unit 608 is preferably implemented as a RAM such as a DRAM, SRAM, etc.

In this configuration, the branch metric generator 602 generates four 4- or 6-bit uncoded bits (e.g., MSBs) and minimum branch metric distances as discussed previously. The generated minimum branch metric distances for branch metrics with labels 00, 10, 01, 11 (e.g., BM00, BM10, BM01, BM11) are then transmitted to the add-compare-select circuitry 604. At the same time, the generated uncoded bits for BM00, BM10, BM01, BM11 are transmitted to the delay unit 608. The add-compare-select circuitry 604 generates a state decision bit for each QAM signal and transmits the generated bits to the trace-back circuitry 606. The trace-back circuitry 606 produces 1 coded information bit and a control signal for selecting one of the four 4- or 6-bit uncoded (i.e., MSBs) bits held in the delay unit 608. The Viterbi decoder 600 thus outputs 1 coded information bit and a 4- or 6-bit uncoded bits.

Figure 6B:
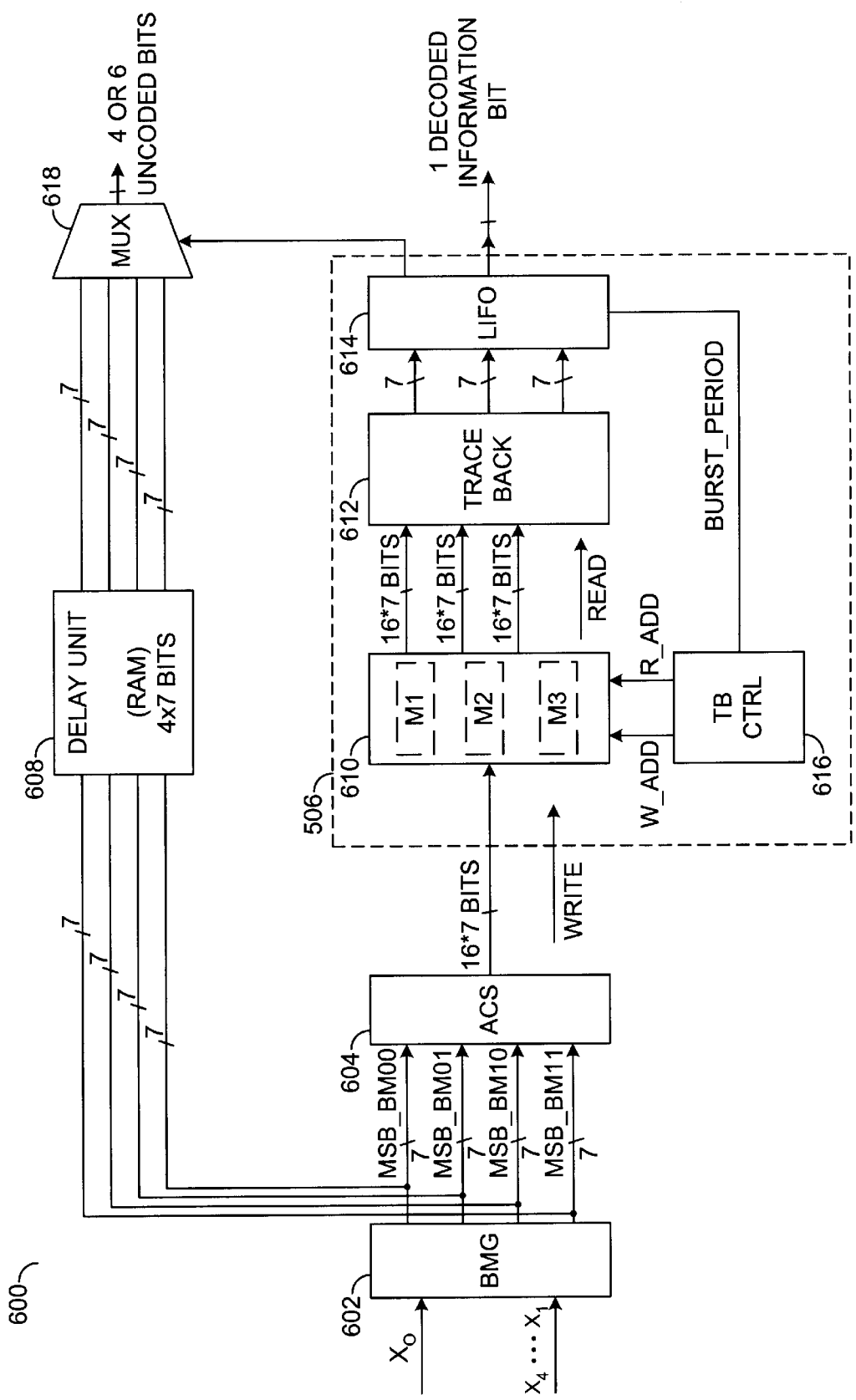
FIG. 6B illustrates a more detailed block diagram of the Viterbi decoder in accordance with one embodiment of the present invention.

FIG. 6B illustrates a more detailed block diagram of the Viterbi decoder 600 in accordance with one embodiment of the present invention. The Viterbi decoder 600 includes a branch metric generator 602, an add-compare-select circuitry 604, a trace-back circuitry 606, a delay unit 608, and a multiplexer 618. The trace-back circuitry 606 further includes a storage unit 610, a trace-back unit 612, a LIFO unit 614, and a trace-back controller 616 In this configuration, the outputs of the add-compare-select circuitry 604 are stored in the storage unit 610 of the trace-back circuitry 606. In a preferred embodiment, the storage unit 610 includes three RAMs of 1×16×32 bits each to store the decision bits for either 64- or 256-QAM signals, where 1 bit corresponds to a decision bit, 16 corresponds to 16 states, and 32 corresponds to 24-read and 8-write operation for read-three-write-one mode.

The trace-back circuitry 606 generates three bits, one for decoded bit and two bits to determine the coset of the uncoded bits, i.e., the MSBs. The delay unit 608 provides the required delay to transmit the four branch metrics to the multiplexer 618. The LIFO unit 614 transmits the 2-bit coset selection signal to the multiplexer 618, which selects one of the four branch metrics as the output of 4 or 6 uncoded bits.

Advantageously, the 64/256 QAM TCM decoder of the present invention provides the benefit of decoding in-phase and quadrature components independently and separately. Since in-phase and quadrature component of 64/256 QAM TCM code can be decoded independently, the present invention reduces branch metric calculation and trellis complexity. In addition, the TCM decoder of the present invention can decode both 64/256 QAM TCM code.

The TCM decoder thus generates eight consecutive 3-bit pairs for parallel branches and 4 information bits from 8 consecutive in-phase component of 256-QAM signals. These recovered data bits can be used to recover the "I" and "Q" components of the original signal as discussed and illustrated in a co-pending U.S. patent application having Ser. No. 09/065,751 (Attorney Docket No. C2-4120/P136A) filed on the same day herewith and entitled "APPARATUS AND METHOD FOR RECOVERING INFORMATION BITS FROM A 64/256-QUADRATURE AMPLITUDE MODULATION TRELLIS CODED MODULATION DECODER," by inventors Dojun Rhee and Chanthachith Souvanthong, assigned to the assignee of the present application and is incorporated herein by reference in its entirety.

While the present invention has been described in terms of several preferred embodiments, there are alterations, permutations, and equivalents which fall within the scope of this invention. It should also be noted that there are alternative ways of implementing both the method and apparatus of the present invention. It is therefore intended that the following appended claims be interpreted as including all such alterations, permutations, and equivalents as fall within the true spirit and scope of the present invention.

What is claimed is:

1. A quadrature amplitude modulation (QAM) trellis coded modulation (TCM) decoder for decoding a stream of QAM TCM signals, each of the signals having a plurality of associated branch metrics, each signal having an in-phase component and a quadrature component, wherein the in-phase component is defined by a plurality of in-phase symbols and the quadrature component is defined by a plurality of quadrature symbols, the decoder comprising:

a first Viterbi decoder configured to receive an in-phase component of a QAM TCM signal for decoding the associated in-phase symbols into an in-phase decoded bit and a plurality of uncoded in-phase bits;

a second Viterbi decoder configured to receive a quadrature component of the QAM TCM signal for decoding the associated quadrature symbols into a quadrature decoded bit and a plurality of uncoded quadrature bits;

a QAM demodulator adapted to receive the stream of QAM TCM signals for sequentially converting each of the QAM TCM signals into an associated in-phase component and an associated quadrature component, wherein the associated in-phase component is defined by a plurality of in-phase symbols and the quadrature component is defined by a plurality of quadrature symbols;

a first depuncture circuitry coupled to the QAM demodulator to receive the in-phase component for adaptively depuncturing the associated in-phase symbols as inputs for the first Viterbi decoder;

a second depuncture circuitry coupled to the QAM demodulator to receive the quadrature component for adaptively depuncturing the associated quadrature symbols as inputs for the second Viterbi decoder;

a first serial-to-parallel circuitry coupled to the first depuncture circuitry to receive the in-phase symbols for arranging the in-phase symbols from a serial sequence into a parallel sequence for input into the first Viterbi decoder; and a second serial-to-parallel circuitry coupled to the second depuncture circuitry to receive the quadrature symbols for arranging the quadrature symbols from a serial sequence into a parallel sequence for input into the second Viterbi decoder.

2. The decoder as recited in claim 1, wherein the QAM TCM decoder is a 64/256 QAM TCM decoder that is capable of decoding either 64- or 256-QAM TCM signals.

3. The decoder as recited in claim 1, wherein the first Viterbi decoder includes:

a first branch metric generator configured to receive the in-phase symbols for determining a branch metric value for each of the branch metrics associated with the signal and a first set of a plurality of uncoded bits for each branch metrics;

a first add-compare-select circuitry coupled to the first branch metric generator to receive the branch metric values and the first set of the plurality of uncoded bits for selecting a first branch metric with the smallest metric value and assigning a first decision bit to each of the selected branch metric; and a first trace-back circuitry coupled to the first add-compare-select circuitry to receive the first decision bit and the first set of uncoded bits for generating the in-phase decoded bit and the plurality of uncoded in-phase bits.

4. The decoder as recited in claim 3, wherein the second Viterbi decoder includes:
   a second branch metric generator configured to receive the quadrature symbols for determining a branch metric value for each of the branch metrics associated with the signal and a second set of a plurality of uncoded bits for each branch metrics;
   a second add-compare-select circuitry coupled to the second branch metric generator to receive the branch metric values and the second set of the plurality of uncoded bits for selecting a second branch metric with the smallest metric value and assigning a second decision bit to each of the selected branch metric; and
   a second trace-back circuitry coupled to the second add-compare-select circuitry to receive the second decision bit and the second set of uncoded bits for generating the quadrature decoded bit and the plurality of uncoded in-phase bits.

5. The decoder as recited in claim 4, wherein the first Viterbi decoder further comprises a first delay unit coupled to the first branch metric generator to receive and store the first set of uncoded in-phase bits, and wherein the second Viterbi decoder further comprises a second delay unit coupled to the second branch metric generator to receive and store the second set of uncoded quadrature bits.

6. The decoder as recited in claim 5, wherein the first trace-back circuitry receives the first decision bit only and generates a first selection signal for selecting one of the first set of uncoded bits in the first delay unit as the plurality of uncoded in-phase bits, and wherein the second trace-back circuitry receives the second decision bit only and generates a second selection signal for selecting one of the second set of uncoded bits in the second delay unit as the plurality of uncoded quadrature bits.

7. The decoder as recited in claim 4, wherein the first trace-back circuitry includes:
   a first storage unit for receiving and storing the first decision bits and the first set of uncoded bits, wherein the first storage unit is accessed in a write-once and read-thrice manner;
   a first trace-back unit configured to access the first storage unit for determining the in-phase decoded bit and the plurality of uncoded in-phase bits by tracing back a plurality of surviving paths to a first unique maximum likelihood path;
   a first last-in-first-out (LIFO) buffer coupled to receive the in-phase decoded bit and the plurality of uncoded in-phase bits; and
   a first trace-back controller coupled to the first LIFO buffer and the first storage unit for controlling input/output access.

8. The decoder as recited in claim 7, wherein the second trace-back circuitry includes:
   a second storage unit for receiving and storing the second decision bits and the second set of uncoded bits, wherein the second storage unit is accessed in a write-once and read-thrice manner;
   a second trace-back unit configured to access the second storage unit for determining the quadrature decoded bit and the plurality of uncoded quadrature bits by tracing back a plurality of surviving paths to a first unique maximum likelihood path;
   a second last-in-first-out (LIFO) buffer coupled to receive the quadrature decoded bit and the plurality of uncoded quadrature bits; and
   a second trace-back controller coupled to the second LIFO buffer and the second storage unit for controlling input/output access.

9. The decoder as recited in claim 6, wherein the first trace-back circuitry includes:
   a first storage unit for receiving and storing the first decision bits and the first set of uncoded bits, wherein the first storage unit is accessed in a write-once and read-thrice manner;
   a first trace-back unit configured to access the first storage unit for determining the in-phase decoded bit and the first selection signal by tracing back a plurality of surviving paths to a first unique maximum likelihood path;
   a first last-in-first-out (LIFO) buffer coupled to receive the in-phase decoded bit and the first selection signal; and
   a first trace-back controller coupled to the first LIFO and the first storage unit for controlling input/output access.

10. The decoder as recited in claim 9, wherein the first delay unit includes a first multiplexer coupled to receive the first set of uncoded bits, wherein first Viterbi decoder uses the first selection signal to select the plurality of uncoded in-phase bits from the first set of uncoded bits.

11. The decoder as recited in claim 9, wherein the second trace-back circuitry includes:
   a second storage unit for receiving and storing the second decision bits and the second set of uncoded bits, wherein the second storage unit is accessed in a write-once and read-thrice manner;
   a second trace-back unit configured to access the second storage unit for determining the quadrature decoded bit and the second selection signal by tracing back a plurality of surviving paths to a first unique maximum likelihood path;
   a second last-in-first-out (LIFO) buffer coupled to receive the quadrature decoded bit and the second selection signal; and
   a second trace-back controller coupled to the second LIFO and the second storage unit for controlling input/output access.

12. The decoder as recited in claim 11, wherein the second delay unit includes a second multiplexer coupled to receive the second set of uncoded bits, wherein the second Viterbi decoder uses the second selection signal to select the plurality of uncoded quadrature bits from the second set of uncoded bits.

13. The decoder as recited in claim 1, wherein the QAM demodulator generates an indicator signal indicating whether the received stream of QAM TCM signals is a 64- or 256-QAM TCM signal stream.

14. The decoder as recited in claim 13, wherein the plurality of uncoded in-phase bits are 4 bits when the received signals are 64-QAM TCM signals.

15. The decoder as recited in claim 13, wherein the plurality of uncoded quadrature bits are 6 bits when the received signals are 256-QAM TCM signals.

16. The decoder as recited in claim 13, wherein the first and second Viterbi decoders receive the indicator signal from the QAM demodulator and decodes the QAM signals in accordance with the indicator signal.

17. A method for decoding a stream of QAM TCM signals to generate decoded in-phase and quadrature bits and a plurality of uncoded in-phase and quadrature bits, each of the signals having a plurality of associated branch metrics, each signal having an in-phase component and a quadrature component wherein the in-phase component is defined by a plurality of in-phase symbols and the quadrature component is defined by a plurality of quadrature symbols, the method comprising:

receiving a stream of QAM TCM signals;

demodulating each of the QAM TCM signals into an in-phase component and a quadrature component comprising the sub-steps of (i) depuncturing the associated in-phase symbols to adaptively add dummy symbols and (ii) converting the sequence of the in-phase symbols from a serial sequence to a parallel sequence;

receiving an in-phase component of a QAM TCM signal;

receiving a quadrature component of the QAM TCM signal;

generating an in-phase decoded bit and a plurality of uncoded in-phase bits by decoding the associated in-phase symbols;

generating a quadrature decoded bit and a plurality of uncoded quadrature bits by decoding the associated quadrature symbols; and determining whether the received QAM TCM signals are 64- or 256-QAM signals.

18. The method as recited in claim 17, wherein two consecutive in-phase symbols and the quadrature symbols are processed in parallel.

19. The method as recited in claim 18, wherein the decoded in-phase bit and the plurality of uncoded in-phase bit generating comprises:

determining a branch metric value for each of the branch metrics associated with the signal and a first set of a plurality of uncoded bits for each branch metrics;

selecting a first branch metric with the smallest metric value and assigning a first decision bit to each of the selected branch metric; and generating the in-phase decoded bit and the plurality of uncoded in-phase bits.

20. The method as recited in claim 19, wherein the decoded quadrature bit and the plurality of uncoded quadrature bit generating comprises:

determining a branch metric value for each of the branch metrics associated with the signal and a second set of a plurality of uncoded bits for each branch metrics;

selecting a second branch metric with the smallest metric value and assigning a second decision bit to each of the selected branch metric; and generating the quadrature decoded bit and the plurality of uncoded in-phase bits.

21. The method as recited in claim 20, further comprising:

storing the first set of uncoded in-phase bits;

storing the second set of uncoded quadrature bits.

22. The method as recited in claim 21, wherein a first selection signal is generated for selecting the plurality of uncoded in-phase bits from the stored first set of the uncoded in-phase bits; and wherein a second selection signal is generated for selecting the plurality of uncoded quadrature bits from the stored second set of the uncoded quadrature bits.

23. The method as recited in claim 21, wherein the plurality of uncoded in-phase bits are 4 bits when the received signals are 64-QAM TCM signals.

24. The method as recited in claim 21, wherein the plurality of uncoded in-phase bits are 6 bits when the received signals are 64-QAM TCM signals.

25. A quadrature amplitude modulation (QAM) trellis coded modulation (TCM) decoder for decoding a stream of QAM TCM signals, each of the signals having a plurality of associated branch metrics, each signal having an in-phase component and a quadrature component, wherein the in-phase component is defined by a plurality of in-phase symbols and the quadrature components defined by a plurality of quadrature symbols, the decoder comprising:

first decoding means configured to receive an in-phase component of a QAM TCM signal for decoding the associated in-phase symbols into an in-phase decoded bit and a plurality of uncoded in-phase bits;

second decoding means configured to receive a quadrature component of the QAM TCM signal for decoding the associated quadrature symbols into a quadrature decoded bit and a plurality of uncoded quadrature bits;

demodulating means for sequentially converting each of the QAM TCM signals into an associated in-phase component and an associated quadrature component, wherein the associated in-phase component is defined by a plurality of in-phase symbols and the quadrature component is defined by a plurality of quadrature symbols;

first depuncturing means for adaptively depuncturing the associated in-phase symbols as inputs for the first decoding means;

second depuncturing means for adaptively depuncturing the associated quadrature symbols as inputs for the second decoding means;

first serial-to-parallel converting means for arranging the in-phase symbols from a serial sequence into a parallel sequence for input into the first decoding means; and second serial-to-parallel converting means for arranging the quadrature symbols from a serial sequence into a parallel sequence for input into the second decoding means.

26. The decoder as recited in claim 25, wherein the first and second decoding means are 64/256 QAM TCM decoders that are capable of decoding either 64- or 256-QAM TCM signals.

27. The decoder as recited in claim 25, wherein the first decoding means includes:

first branch metric generating means for determining a branch metric value for each of the branch metrics associated with the signal and a first set of a plurality of uncoded bits for each branch metrics;

first add-compare-select means for selecting a first branch metric with the smallest metric value and assigning a first decision bit to each of the selected branch metric; and first trace-back means for generating the in-phase decoded bit and the plurality of uncoded in-phase bits.

28. The decoder as recited in claim 27, wherein the second decoding means includes:

second branch metric generating means for determining a branch metric value for each of the branch metrics associated with the signal and a second set of a plurality of uncoded quadrature bits for each branch metrics;

second add-compare-select means for selecting a second branch metric with the smallest metric value and assigning a second decision bit to each of the selected branch metric; and second trace-back means for generating the quadrature decoded bit and the plurality of uncoded in-phase bits.

29. The decoder as recited in claim 28, wherein the first decoding means further comprises a first delay means for storing the first set of uncoded in-phase bits, and wherein the second decoding means further comprises a second delay means for storing the second set of uncoded quadrature bits.

30. The decoder as recited in claim 28, wherein the first trace-back means receives the first decision bit only and generates a first selection signal for selecting one of the first set of uncoded bits in the first delay means as the plurality of uncoded in-phase bits, and wherein the second trace-back means receives the second decision bit only and generates a second selection signal for selecting one of the second set of uncoded bits in the second delay means as the plurality of uncoded quadrature bits.

31. The decoder as recited in claim 28, wherein the first trace-back means includes:
first storage means for receiving and storing the first decision bits and the first set of uncoded bits, wherein the first storage unit is accessed in a write-once and read-thrice manner;
first tracing-back means configured to access the first storage means for determining the in-phase decoded bit and the plurality of uncoded in-phase bits by tracing back a plurality of surviving paths to a first unique maximum likelihood path;
first last-in-first-out (LIFO) buffer coupled to receive the in-phase decoded bit and the plurality of uncoded in-phase bits; and
first trace-back controller coupled to the first LIFO buffer and the first storage means for controlling input/output access.

32. The decoder as recited in claim 31, wherein the second trace-back includes:
second storage means for receiving and storing the second decision bits and the second set of uncoded bits, wherein the second storage unit is accessed in a write-once and read-thrice manner;
second tracing-back means configured to access the second storage means for determining the quadrature decoded bit and the plurality of uncoded quadrature bits by tracing back a plurality of surviving paths to a first unique maximum likelihood path;
second last-in-first-out (LIFO) buffer coupled to receive the quadrature decoded bit and the plurality of uncoded quadrature bits; and
second trace-back controller coupled to the second LIFO buffer and the second storage means for controlling input/output access.

33. The decoder as recited in claim 30, wherein the first trace-back means includes:
a first storage unit for receiving and storing the first decision bits and the first set of uncoded bits, wherein the first storage means is accessed in a write-once and read-thrice manner;
first tracing-back means configured to access the first storage means for determining the in-phase decoded bit and the first selection signal by tracing back a plurality of surviving paths to a first unique maximum likelihood path;
a first last-in-first-out (LIFO) buffer coupled to receive the in-phase decoded bit and the first selection signal; and
a first trace-back controller coupled to the first LIFO buffer and the first storage means for controlling input/output access.

34. The decoder as recited in claim 33, wherein the first delay means includes a first multiplexer coupled to receive the first set of uncoded bits, wherein first decoding means uses the first selection signal to select the plurality of uncoded in-phase bits from the first set of uncoded bits.

35. The decoder as recited in claim 33, wherein the second trace-back means includes:

second storage means for receiving and storing the second decision bits and the second set of uncoded bits, wherein the second storage means is accessed in a write-once and read-thrice manner;
second tracing-back means configured to access the second storage unit for determining the quadrature decoded bit and the second selection signal by tracing back a plurality of surviving paths to a first unique maximum likelihood path;
a second last-in-first-out (LIFO) buffer coupled to receive the quadrature decoded bit and the second selection signal; and
a second trace-back controller coupled to the second LIFO buffer and the second storage means for controlling input/output access.

36. The decoder as recited in claim 35, wherein the second delay means includes a second multiplexer coupled to receive the second set of uncoded bits, wherein the second decoding means uses the second selection signal to select the plurality of uncoded quadrature bits from the second set of uncoded bits.

37. The decoder as recited in claim 28, wherein the demodulating means generates an indicator signal indicating whether the received stream of QAM TCM signals is a 64- or 256-QAM TCM signal stream.

38. The decoder as recited in claim 37, wherein the plurality of uncoded in-phase bits are 4 bits when the received signals are 64-QAM TCM signals.

39. The decoder as recited in claim 37, wherein the plurality of uncoded quadrature bits are 6 bits when the received signals are 256-QAM TCM signals.

40. The decoder as recited in claim 37, wherein the first and second decoding means receive the indicator signal from the demodulating means and decodes the QAM signals in accordance with the indicator signal.

41. A quadrature amplitude modulation (QAM) trellis coded modulation (TCM) decoder for decoding a stream of QAM TCM signals, each of the signals having a plurality of associated branch metrics, each signal having an in-phase component and a quadrature component, wherein the in-phase component is defined by a plurality of in-phase symbols and the quadrature component is defined by a plurality of quadrature symbols, the decoder comprising:
a first Viterbi decoder configured to receive an in-phase component of a QAM TCM signal for decoding the associated in-phase symbols into an in-phase decoded bit and a plurality of uncoded in-phase bits, wherein said first Viterbi decoder further comprises (i) a first branch metric generator configured to receive the in-phase symbols for determining a branch metric value for each of the branch metrics associated with the signal and a first set of a plurality of uncoded bits for each branch metrics, (ii) a first add-compare-select circuitry coupled to the first branch metric generator to receive the branch metric values and the first set of the plurality of uncoded bits for selecting a first branch metric with the smallest metric value and assigning a first decision bit to each of the selected branch metric, (iii) a first trace-back circuitry coupled to the first add-compare-select circuitry to receive the first decision bit and the first set of uncoded bits for generating the in-phase decoded bit and the plurality of uncoded in-phase bits, and (iv) a first delay unit coupled to the first branch metric generator to receive and store the first set of uncoded in-phase bits;
a second Viterbi decoder configured to receive a quadrature component of the QAM TCM signal for decoding the associated quadrature symbols into a quadrature decoded bit and a plurality of uncoded quadrature bits, wherein said second Viterbi decoder further comprises (i) a second branch metric generator configured to receive the quadrature symbols for determining a branch metric value for each of the branch metrics associated with the signal and a second set of a plurality of uncoded bits for each branch metrics, (ii) a second add-compare-select circuitry coupled to the second branch metric generator to receive the branch metric values and the second set of the plurality of uncoded bits for selecting a second branch metric with the smallest metric value and assigning a second decision bit to each of the selected branch metric, (iii) a second trace-back circuitry coupled to the second add-compare-select circuitry to receive the second decision bit and the second set of uncoded bits for generating the quadrature decoded bit and the plurality of uncoded in-phase bits, and (iv) a second delay unit coupled to the second branch metric generator to receive and store the second set of uncoded quadrature bits.

* * * * *